(12) United States Patent
Pagnanelli

(10) Patent No.: US 9,685,975 B2
(45) Date of Patent: Jun. 20, 2017

(54) DISTRIBUTED COMBINER FOR PARALLEL DISCRETE-TO-LINEAR CONVERTERS

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 14/996,497

(22) Filed: Jan. 15, 2016

(65) Prior Publication Data

US 2016/0226509 A1 Aug. 4, 2016

Related U.S. Application Data

(60) Provisional application No. 62/109,517, filed on Jan. 29, 2015, provisional application No. 62/121,794, filed on Feb. 27, 2015, provisional application No. 62/174,569, filed on Jun. 12, 2015, provisional application No. 62/254,504, filed on Nov. 12, 2015.

(51) Int. Cl.
| | |
|---|---|
| *G06F 7/42* | (2006.01) |
| *H03M 1/66* | (2006.01) |
| *H03F 3/21* | (2006.01) |
| *H03M 1/08* | (2006.01) |
| *H03M 3/00* | (2006.01) |

(52) U.S. Cl.
CPC .......... *H03M 1/661* (2013.01); *H03F 3/211* (2013.01); *H03M 1/08* (2013.01); *H03M 1/0836* (2013.01); *H03M 3/30* (2013.01); *H03M 1/662* (2013.01); *H03M 3/50* (2013.01)

(58) Field of Classification Search
CPC .......... H03M 1/661; H03M 1/08; H03M 3/30; H03M 1/0836; H03M 1/662; H03F 3/211
USPC ...... 333/202, 100, 24 R, 124–128, 136, 138, 333/118, 129, 131; 327/361, 355, 407
See application file for complete search history.

(56) References Cited

U.S. PATENT DOCUMENTS

| | | | | |
|---|---|---|---|---|
| 3,697,895 | A | * | 10/1972 | Beck ........................ H03H 7/48 333/124 |
| 4,774,481 | A | | 9/1988 | Edwards et al. |
| 5,341,135 | A | | 8/1994 | Pearce |

(Continued)

FOREIGN PATENT DOCUMENTS

WO WO9215153 A2 9/1992

OTHER PUBLICATIONS

International Search Report and Written Opinion in corresponding PCT application No. PCT/US2016/013756.

(Continued)

*Primary Examiner* — Dinh T Le
(74) *Attorney, Agent, or Firm* — Joseph G. Swan, P.C.

(57) ABSTRACT

Provided are, among other things, systems, apparatuses methods and techniques for providing a complete output signal from a set of partial signals, which in turn have been generated by parallel processing paths in the time-interleaved and/or frequency-interleaved conversion of discrete signals to linear signals (i.e., discrete-to-linear conversion). One such apparatus includes a distributed network comprising a plurality of ladder networks through which input signals propagate before being combined to form an output signal.

37 Claims, 18 Drawing Sheets

(56) References Cited

U.S. PATENT DOCUMENTS

| | | | |
|---|---|---|---|
| 5,469,129 A | 11/1995 | Dydyk | |
| 5,907,242 A | 5/1999 | Gard | |
| 6,888,484 B2 | 5/2005 | Kiss et al. | |
| 7,474,156 B2* | 1/2009 | Fujii | H03F 3/602 330/124 R |
| 7,633,417 B1 | 12/2009 | Yeh | |
| 8,155,238 B2 | 4/2012 | Muller et al. | |
| 8,203,484 B2* | 6/2012 | Chu et al. | H01Q 3/2682 342/375 |
| 9,391,656 B2* | 7/2016 | Pagnanelli | H04B 1/1081 |
| 2004/0208249 A1 | 10/2004 | Risbo et al. | |
| 2004/0213356 A1 | 10/2004 | Burke | |
| 2005/0099327 A1 | 5/2005 | Robinson et al. | |
| 2011/0063169 A1 | 3/2011 | Chen et al. | |
| 2012/0293352 A1 | 11/2012 | Adlerstein | |

OTHER PUBLICATIONS

International search report and written opinion from PCT application Serial No. PCT/US2010/060789.

Eshraghi A et al: "A Comparative Analysis of Parallel Delta—Sigma ADC Architectures", IEEE Transactions on Circuits and Systems Part I: Regular Papers, IEEE Service Center, New York, NY, US, vol. 51, No. 3, Mar. 1, 2004 (Mar. 1, 2004), pp. 450-458, XP011109280, ISSN: 1057-7122, DOI: D01:10.1109/TCSI.2004. 823663.

Harris F J et al: "Implementation considerations and limitations for dynamic range enhanced analog to digital converters", IEEE International Conference on Acoustics, Speech, and Signal Processing, 1989. ICASSP-89., May 3, 1989 (May 23, 1989), pp. 1286-1289, XP010083173.

D. Anastassiou "Error Diffusion Coding for A/D Conversion," IEEE Transactions on Circuits and Systems, vol. 36, 1989.

A. Petraglia and S. K. Mitra, "High Speed A/D Conversion Using QMF Banks," Proceedings: IEEE Symposium on circuits and Systems, 1990.

Aziz, P., "Multi Band Sigma Delta Analog to Digital Conversion", IEEE International Conference on Acoustics, Speech, and Signal Processing, 1994.

S. R. Velazquez, T. Q. Nguyen, and S. R. Broadstone, "Design of Hybrid Filter Banks for Analog/Digital Conversion," IEEE Transactions on Signal Processing, 1998.

A. Fernandez-Vazquez and G. Jovanovic-Dolecek, "Design of Real and Complex Linear-Phase IIR Modified QMF Banks," IEEE Asia Pacific Conference on Circuits and Systems, 2006.

P. C. R. Brandao and A. Petraglia, "A Switched-Capacitor Hadamard Filter Bank in 0.35 m CMOS," Proceedings: 48th Midwest Symposium on Circuits and Systems, 2005.

P. M. Furth and A. G. Andreou, "A Design Framework for Low Power Analog Filter Banks", IEEE Transactions on Circuits and Systems I: Fundamental Theory and Applications, 1995.

R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997.

K- Chao, S. Nadeem, W. Lee, and C. Sodini, "A Higher Order Topology for Interpolative Modulators for Oversampling A/D Converters," IEEE Transactions on Circuits and Systems, 1990.

Office Action dated Aug. 17, 2015, from European Patent Office in European application EP 10798430.4.

J. Pham and A.C. Carusone, "A Time-Interleaved [Delta-Sigma]-DAC Architecture Clocked at the Nyquist Rate," IEEE Transactions on Circuits and Systems II: Express Briefs, 2008.

Krall, C., et al., "Time-Interleaved Digital-to-Analog Converters for UWB Signal Generation", IEEE International Conference on Ultra-Wideband, 2007. ICUWB 2007, pp. 366-371, ISBN: 978-1-4244-0521-3.

Report/Translation of Office Action in Japanese Patent Application No. 2012-544832.

* cited by examiner

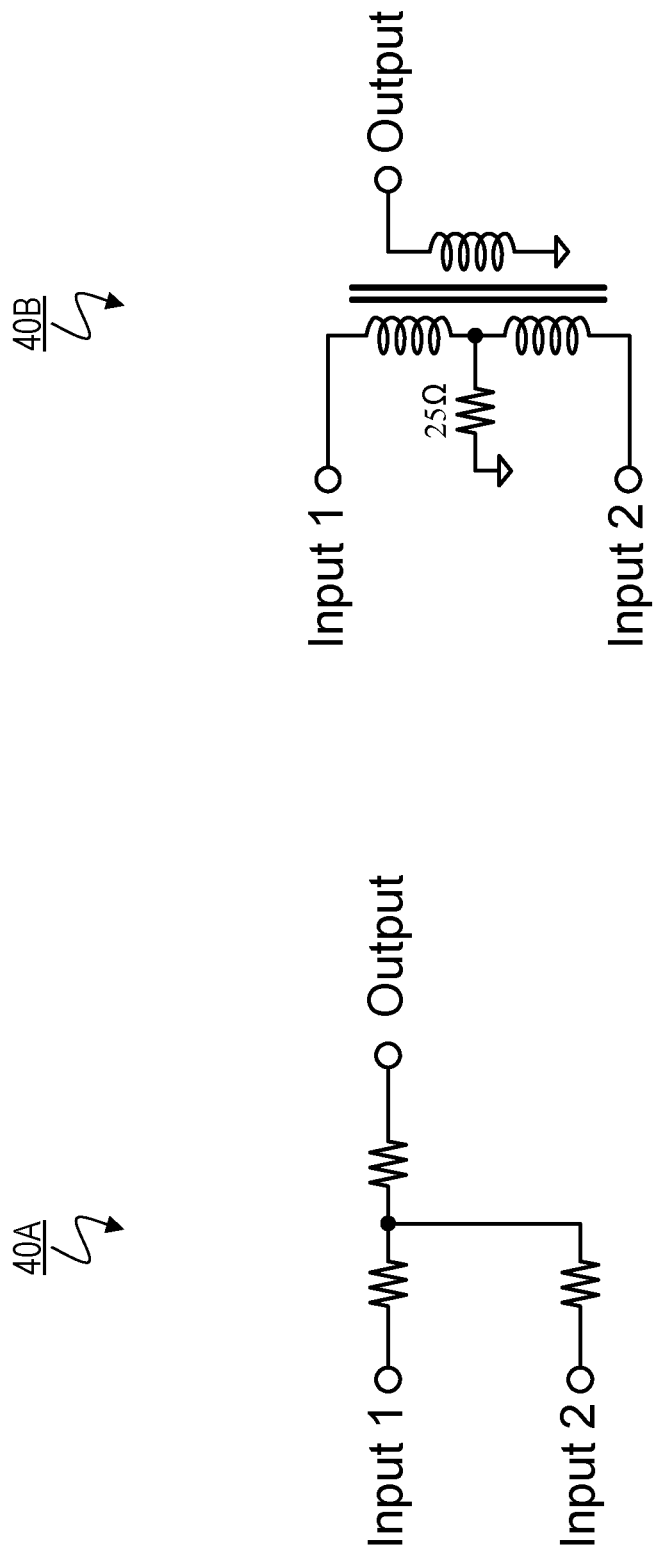

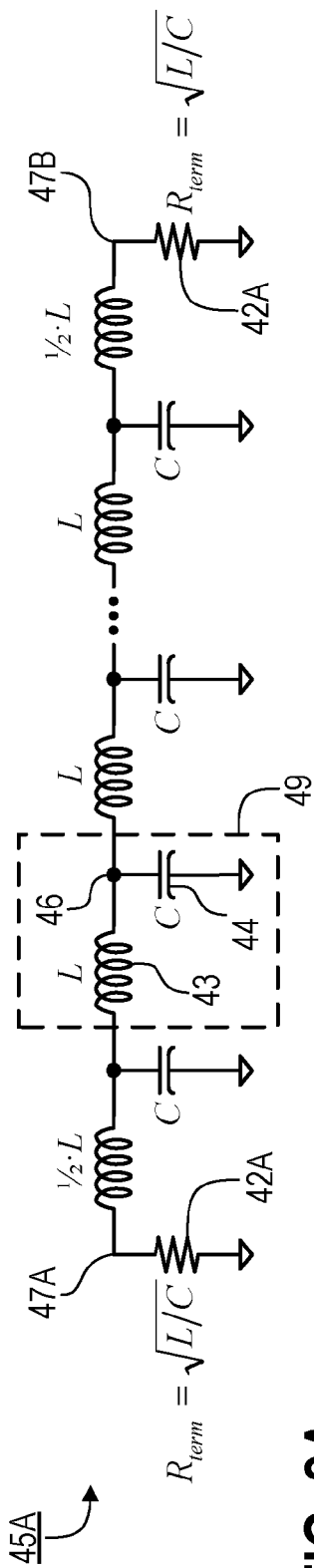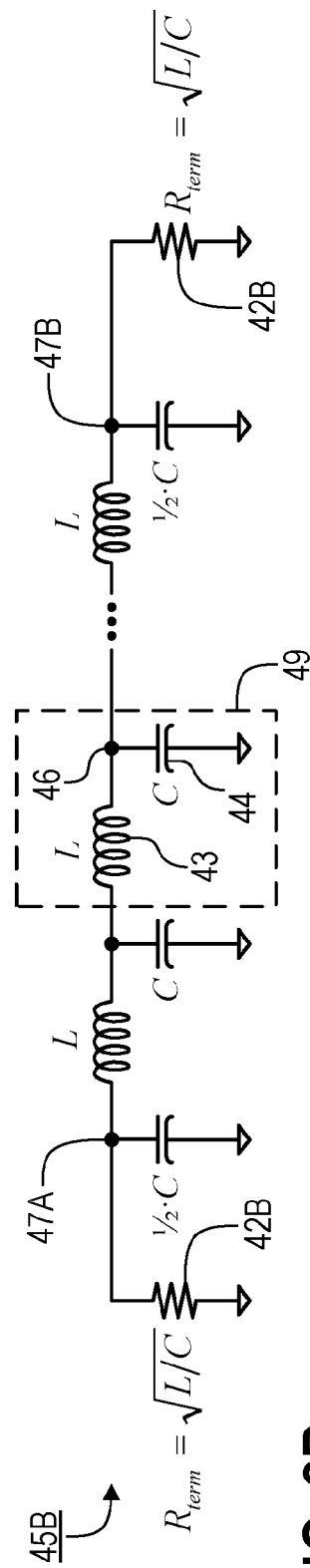
FIG. 3A (Prior Art)
FIG. 3B (Prior Art)

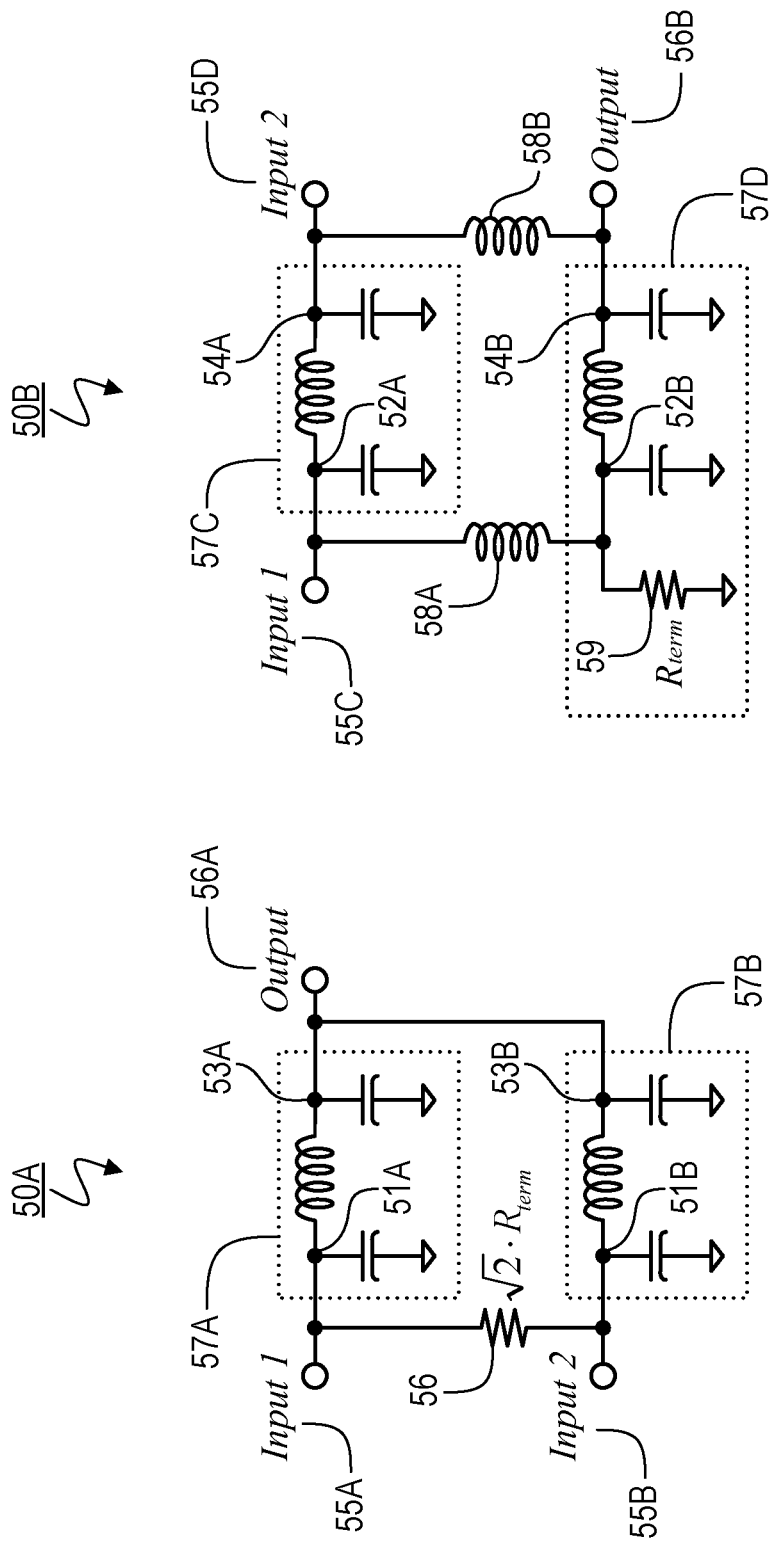

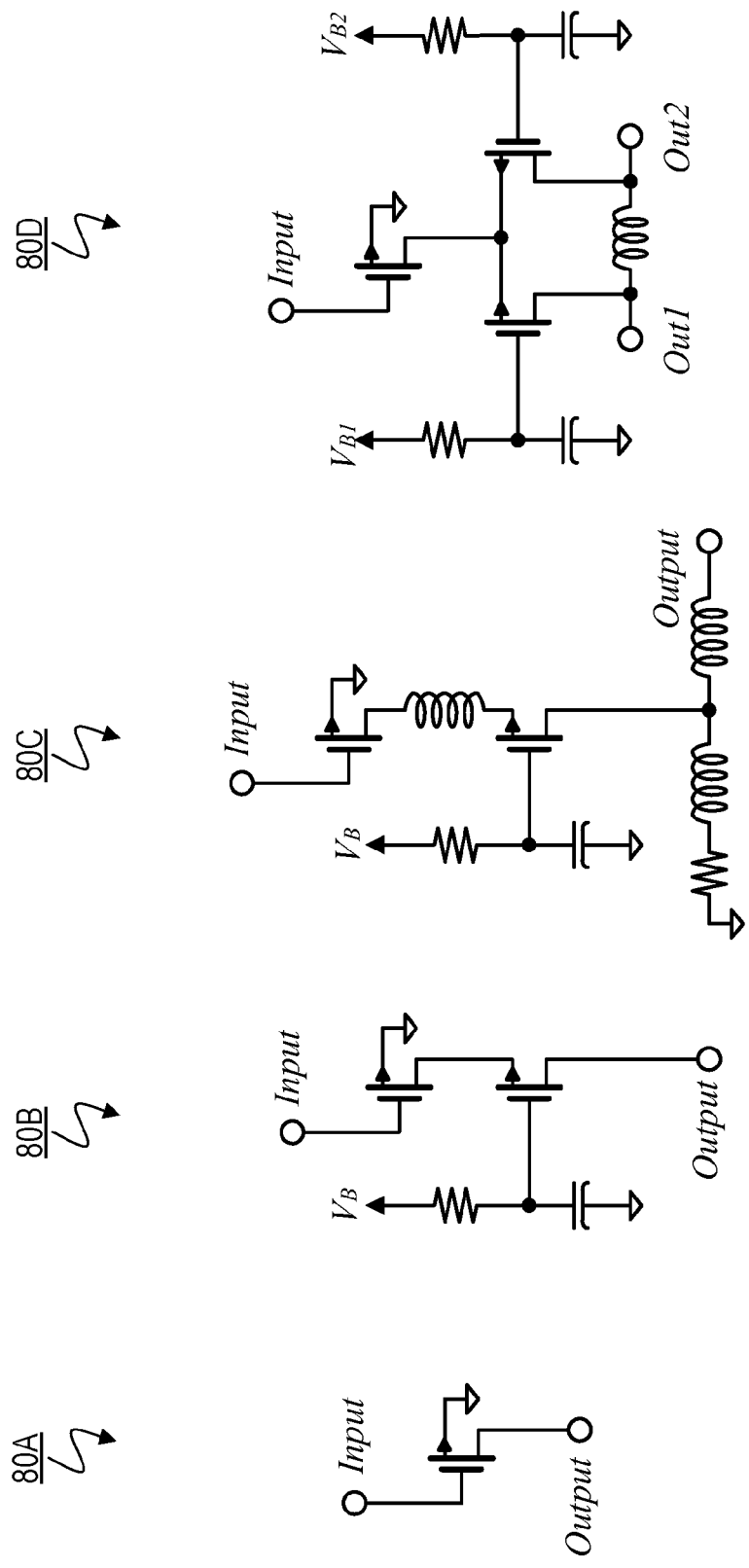

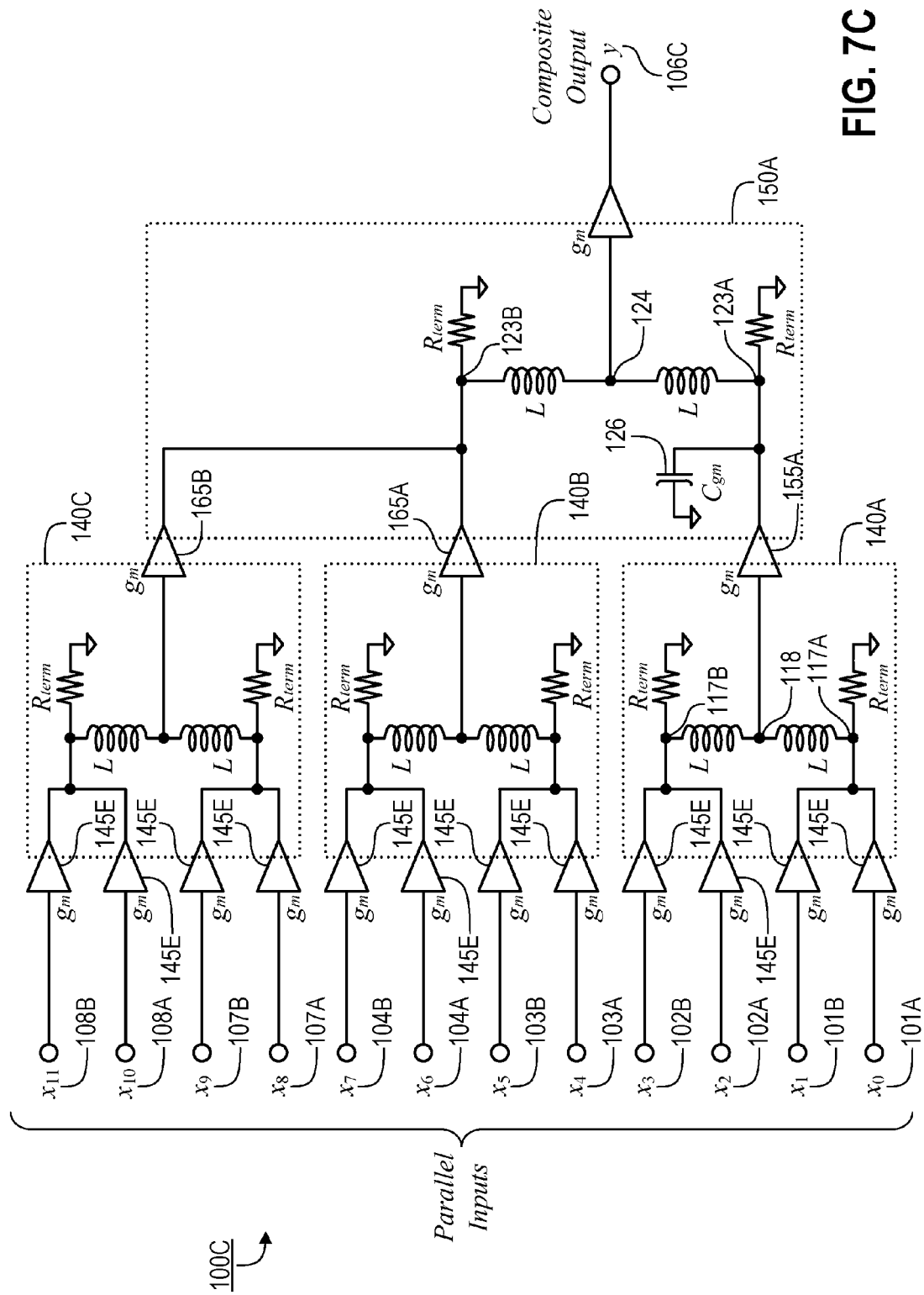

DISTRIBUTED COMBINER FOR PARALLEL DISCRETE-TO-LINEAR CONVERTERS

FIELD OF THE INVENTION

The present invention pertains to systems, apparatuses, methods and techniques for reconstructing a complete output signal from the set of partial signals which are generated by parallel processing paths in the time-interleaved and/or frequency-interleaved conversion of discrete signals to linear signals (i.e., discrete-to-linear conversion). It is particularly applicable to converters that operate at very high sampling rates and with high instantaneous bandwidth.

BACKGROUND

The method of implementing a particular function using multiple processing paths is conventionally referred to as parallel processing. When an input signal is treated as multiple signals that are segmented in time (e.g., a series of subsequences that collectively represent a single, complete sequence), the parallel processing operation typically is said to employ techniques of time-interleaving, polyphase decomposition, or multirate processing. When an input signal is treated instead as multiple signals that are segmented in frequency (e.g., a series of narrow frequency bands that represent a single, wider frequency band), the parallel processing operation typically is said to employ techniques of frequency interleaving, or frequency decomposition. To improve instantaneous bandwidth, multiple data converters can be operated in parallel using these time interleaving (time slicing) and/or frequency interleaving (frequency slicing) techniques. In conventional time interleaving, a high-speed sampling clock is decomposed into lower-speed sampling clocks at different phases. Each converter in the time-interleaved array is clocked with a different clock phase, such that the conversion operation is distributed in time across multiple converters. While converter #1 is processing the first sample, converter #2 is processing the next sample, and so on. In conventional frequency interleaving, the total bandwidth of an input signal is divided into multiple, smaller sub-bands. Each sub-band is individually downsampled and converted at a subsampled rate, before, e.g., being upsampled and recombined at a full rate. While converter #1 is processing the first sub-band, converter #2 is processing the second sub-band, band, so on. For both time-interleaved and frequency-interleaved operations, a final output signal is constructed (i.e., reconstructed) by combining the outputs of the parallel converters.

According to one representative implementation of a time-interleaved converter (e.g., ADC 10), shown in FIG. 1A, a full-rate input signal (e.g., signal 2 sampled at $f_S$) is converted to a total of m sub-rate signals (e.g., signals 12A-C sampled at $$\frac{1}{m} \cdot f_S)$$

within serial-to-parallel demultiplexer 11. According to conventional multirate processing, the output of each parallel processing path (e.g., outputs 12A-C) is the sequence of samples that would be produced by subsampling, at a particular sample-time offset (i.e., at a particular subsampling phase), the sequence of samples representing the input signal (i.e., the input signal is a complete signal and the output of each parallel path represents a different polyphase component of that complete signal). A compete analog version of the input signal is constructed at the output of the converter (e.g., complete analog signal 4) through a process which involves: 1) delaying each of the subsampled sequences (subsequences) in incrementally larger multiples of the full-rate period $1/f_S$ (e.g., time-offset resampling by registers 13A-C); 2) converting each of the delayed subsequences from discrete-time samples to continuous-time signals (e.g., digital-to analog conversion by DACs 14A-C); and 3) summing together each of the delayed, continuous-time signals (e.g., summation by combiners 18A&B). Each parallel path of converter 10 (e.g., delay paths 16A-C) operates at a submultiple of the overall sampling rate, due to the reduced amount of data contained within each of the subsampled sequences. The ratio of the overall sampling rate (i.e., the full-rate of the input signal) to the parallel subsampling rate (i.e., the sub-rate associated with each parallel processing path) conventionally is referred to as the polyphase decomposition factor, and is generally equal to the number of parallel processing paths.

According to one representative implementation of a frequency-interleaved converter (e.g., ADC 20), shown in FIG. 1B, parallel signal processor 21 converts a full-bandwidth ($B_F$) input signal (e.g., signal 2 sampled at $f_S=2 \cdot B_F$) into a total of m baseband signals with a minimally overlapping fractional bandwidth (e.g., signals 12A-C with bandwidth $$\frac{1}{m} \cdot B_F$$

and subsampled rate $$\frac{1}{m} \cdot f_S).$$

More specifically, the input signal spectrum is divided into narrowband segments to produce fractional bandwidth signals, which are separated out and downsampled (downconverted) to produce sub-rate outputs 22A-C. A compete analog version of the input signal is constructed at the output of the converter (e.g., complete analog signal 4) through a process which involves: 1) converting each of the resulting baseband signals (e.g., sub-rate signals 22A-C) from the digital domain to the analog domain (e.g., digital-to analog conversion by DACs 23A-C); 2) upconverting each of the analog signals from baseband to a central frequency that coincides with the fractional bandwidth originally occupied by the signal (e.g., upconversion by mixers 24A-C to the signal's previous frequency band); and 3) summing together each of the upconverted, continuous-time signals (e.g., summation by combiners 28A&B). Each parallel path of converter 20 (e.g., frequency paths 27A-C) operates at a submultiple of the overall sampling rate, due to the reduced signal bandwidth in each of the subdivided, downconverted bands.

Another parallel processing structure that is associated with conventional data conversion (e.g., ADC and DAC), is multi-stage delta sigma ($\Delta\Sigma$) modulator 30, illustrated in FIG. 1C. A conventional multi-stage $\Delta\Sigma$ modulator, or MASH modulator, uses multiple processing stages to shape away from a frequency band of interest, the conversion noise introduced by a coarse quantizer. A modulator with a second-order response, shapes the quantization noise of a coarse quantizer with a transfer function $H_{NTF}(z)$ given by $$H_{NTF}(z)=1+\alpha \cdot z^{-1}+z^{-2},$$

where z is the Z-transform variable representing a delay of one sample period, and the coefficient α determines the location of a spectral null in the noise-shaped response. Multi-stage (i.e., MASH) structures provide a means for increasing the overall order of a noise-shaped response, without increasing the order of the noise shaping performed by an individual stage. In a conventional multi-stage arrangement, a first stage processes an input signal, and subsequent stages process the residual noise of the previous stage (e.g., first stage 36A processes input signal 32A, and second stage 36B processes residual noise 32B from the output of adder 31C). Consequently, if each of stages 36A&B of modulator 30 performs noise shaping with a second-order response, then it can be shown that the overall modulator provides the benefit of fourth-order shaping with transfer function $H_{NTF}^2(z)$, given by $$H_{NTF}^2(z)=(1+\alpha \cdot z^{-1}+z^{-2})^2,$$

such that more conversion noise (e.g., from coarse quantizers 34A&B) is shaped away from a frequency band of interest. To realize this benefit, however, additional processing is needed for signal reconstruction and combining (e.g., filter and summation within circuit 36C). For second-order stages, this additional processing involves: 1) applying a transfer function of $H_{NTF}(z)$ to output 35B of the second stage, using two delay operations (e.g., within pipeline registers 37A&B of stage 36B), one multiplication operation (e.g., within multiplier 39 of combiner 36C), and two addition operation (e.g., within adders 38A-B of combiner 36C); and then 2) combining filtered output 35C of the second stage, with output 35A of the first stage, to produce final output 35D.

To keep pace with advances in the digital information processing bandwidth of computers and signal processors, time/frequency interleaving and multi-stage noise shaping techniques are becoming increasingly utilized as a means of enhancing the capabilities of conventional D/A converters. To operate at the highest possible sampling rates, therefore, circuits capable of wideband signal reconstruction (e.g., continuous-time summation) are needed for conventional time-interleaved D/A converters, such as converter 10 of FIG. 1A, for conventional frequency-interleaved converters, such as converter 20 of FIG. 1B, and for conventional multi-stage modulators, such as modulator 30 of FIG. 1C. Circuits used for the summation of continuous-time signals conventionally are referred to as power combiners (or splitters, since the same circuit is often able to split a signal into two separate paths). Resistive network 40A, illustrated in FIG. 2A, represents one type of conventional power combiner. Purely resistive networks, such as two-way combiner 40A, offer wideband operation at the expense of what generally is an unacceptably high level of signal attenuation (e.g., 6 dB of attenuation for a 2-way combiner). A second type of conventional power combiner, which overcomes the problem of unacceptably high signal attenuation, is transformer 40B of FIG. 2B. Although as a signal combiner, the transformer combines signals with less attenuation, transformers generally are not well suited for high frequency operation due to the poor high-frequency coupling properties of conventional ferrite core materials.

A third type of conventional power combiner is represented by circuits which perform continuous-time signal summation and are constructed from actual or "artificial" transmission lines. The term "artificial" transmission line is conventionally used to describe ladder networks, such as passive ladder networks 45A&B of FIGS. 3A&B, respectively, which consist of concatenated inductor-capacitor sections (e.g., L-section 49), because such a structure approximates the general properties of an actual transmission line (e.g., characteristic impedance, propagation delay, minimal attenuation, etc.). Each of passive ladder networks 45A&B comprises L-sections (e.g., L-section 49) with a series inductance L (e.g., from discrete inductor 43) and a shunt capacitance C (e.g., from discrete capacitor 44) that are joined together at a junction point (e.g., interior junction point 46). At the terminal junctions points (e.g., outer junction points 47A&B), which are located on each end of the ladder network, a resistive element provides a shunt termination that is equal to the characteristic impedance of each L-section, given by $R_{term}=\sqrt{L/C}$ (e.g., the shunt termination provided by resistors 42A&B). Ladder network 45A employs a configuration where the first and last reactive elements are series inductors with inductance equal to ½·L, and ladder network 45B employs a configuration where the first and last reactive elements are shunt capacitors with capacitance equal to ½·C. Each L-section of ladder networks 45A&B, introduces a propagation delay $t_{PD}$ of $$t_{PD}=\sqrt{LC},$$

and overall, each circuit produces a lowpass response with a bandwidth that is approximately given by $$BW \approx \frac{1}{\pi\sqrt{LC}}.$$

The upper cutoff frequency of the lowpass response preferably is greater than the maximum frequency at which the apparatus is intended to operate.

Examples of conventional circuits which employ passive ladder networks for continuous-time summation are the Wilkinson power combiner (e.g., power combiner 50A illustrated in FIG. 4A) and the branch-line coupler (e.g., coupler 50B of FIG. 4B). Combiner 50A combines two input signals into one output signal, utilizing two unterminated ladder networks (e.g., first ladder network 57A and second ladder network 57B) in a configuration where: 1) the input of first ladder network 57A is coupled to the input of second ladder network 57B by a resistor with value $\sqrt{2}\cdot R_{term}$ ohms, where $R_{term}$ is the characteristic impedance of each ladder network (e.g., input 55A is resistively coupled to input 55B at terminal junction points 51A&B); and 2) the output of first ladder network 57A is coupled to the output of second ladder network 57B by a short circuit (i.e., the output of the first ladder network is directly coupled to the output of the second ladder network at terminal junction points 53A&B). Such a configuration is advantageous in that for signal sources and signal loads having a matched impedances equal to $R_{term}/\sqrt{2}$, there is: 1) minimal attenuation (loss) of narrowband input signals propagating from the input ports to the output port; and 2) maximum isolation (loss) between narrowband input signals propagating from one input port to the other input port (i.e., minimal attenuation and maximum isolation occurs when the impedance seen looking back into the source on each of input ports 55A&B is equal to $R_{term}/\sqrt{2}$, and the impedance seen looking into the load on output port 56A also is equal to $R_{term}/\sqrt{2}$). Such a configuration is disadvantages for high-speed (wideband) data converter applications, however, because the low-frequency components and/or high-frequency components of wideband input signals are significantly attenuated by the apparatus. Another disadvantage is that the current sources and loads typically utilized in data converter applications, have uncontrolled impedances (e.g., source and load impedances typically are not controlled to equal $R_{term}/\sqrt{2}$).

Combiner 50B, illustrated in FIG. 4B, is a representative example of a conventional branch-line coupler. Combiner 50B is similar to combiner 50A in that it utilizes two passive ladder networks (e.g., ladder networks 57C&D) to combine two input signals into one output signal. Each end of first ladder network 57C is unterminated and is coupled to an input signal (e.g., input signals 55C&D). One end of second ladder network 57D is terminated in a characteristic impedance of $R_{term}$ (e.g., terminated by shunt resistor 59), and the other end is unterminated and coupled to an output signal (e.g., output signal 56B). In combiner 50B, the ends of first ladder network 57C are coupled to the corresponding ends of second ladder network 57D by inductors, such that: 1) input 55C is inductively coupled (e.g., via inductor 58A) to the terminated end of network 57D at terminal junction points 52A&B; and 2) input 55D is inductively coupled (e.g., via inductor 58B) to output 56B at terminal junction points 54A&B. With respect to high-speed data converter applications, combiner 50B has advantages and disadvantages which are similar to those of combiner 50A, but combiner 50B has the additional disadvantage that input signals 55C&D are combined in quadrature to form output signal 56B, such that during the combining process, one of the input signals gets phase shifted by 90 degrees relative to the other input signal.

In addition to the representative power combiners described above, active elements are sometimes incorporated into ladder networks (i.e., forming active ladder networks) as a means of improving the bandwidth and signal attenuation associated with certain types of conventional power combiners (and power splitters). For example, conventional power combiner 60 illustrated in FIG. 5A, sometimes is referred to as a distributed power combiner. Combiner 60 produces a single output (e.g., output 63A) by summing two different input signals (e.g., inputs 64A&B), using: 1) two input transmission lines (e.g., active ladder networks 65B&C); 2) a single output transmission line (e.g., active ladder network 65A); and 3) multiple active elements (e.g., gain cells 62A&B). In a conventional distributed combiner, such as circuit 60 of FIG. 5A, the intrinsic capacitances of active elements (e.g., the intrinsic input or output capacitance of gain cells 62A&B) are grouped with discrete inductors (e.g., inductor 61) to form the reactive impedance segments (e.g., L-sections 67A&B) of an artificial transmission line (e.g., input transmission lines 55B&C and output transmission line 65A). Grouping multiple active elements with discrete inductors to form L-sections, results in an overall bandwidth BW that is approximately determined by the bandwidth of each L-section according to $$BW \approx \frac{1}{\pi\sqrt{LC_{gm}}},$$

where L is the total inductance associated with each L-section, and $C_{gm}$ is the shunt (e.g., intrinsic input or output) capacitance associated with an active device in each L-section. Furthermore, the overall (voltage) gain $A_V$ of combiner 60 increases linearly as the number of active elements increases, according to $$A_V = \frac{1}{2} \cdot n \cdot g_m \cdot R_{term},$$

where: 1) n is the equal number of active elements (i.e., gain cells) included in an input transmission line; 2) $g_m$ is the transconductance associated with each gain cell; and 3) $R_{term}=\sqrt{L/C_{gm}}$ is the terminating resistance for an artificial transmission line (i.e., the shunt resistance at a terminal junction point). For any input signal, therefore, the gain of combiner 60 is independent of bandwidth, and depends only on the number of gain cells distributed across a ladder network (i.e., the number of active device in each input transmission line). The gain cells associated with each of the reactive impedance segments typically are implemented using conventional topologies that include: 1) the common-source amplifier 80A of FIG. 6A; 2) the variable-gain cascode 80B of FIG. 6B; 3) the broadband cascode 80C of FIG. 6C; and/or 4) the variable-gain/delay amplifier 80D of FIG. 6D.

Conventionally, a distributed power combiner comprises multiple input transmission lines and a single output transmission line, where: 1) one end of each transmission line is terminated (e.g., by shunt resistors 69A-C) in the characteristic impedance of each reactive impedance segment (i.e., L-section), given by $R_{term}=\sqrt{L/C_{gm}}$; 2) the other (opposite) end of each transmission line is unterminated and used for accepting input signals or providing output signals; 3) the number of input transmission lines establishes the number of input signals that are combined into a single output signal (i.e., the power combination ratio); 4) the relative number of active devices (i.e., gain cells) associated with each input transmission line, determines the proportion with which the input signals are combined into a single output signal; and 5) the total number of transmission lines (i.e., the number of input transmissions lines plus the number of output transmission lines) is equal to one more than the number of input signals. Similar structures, such as circuit 70 shown in FIG. 5B, can be utilized to split (divide) an input signal (e.g., input signal 74A) into multiple output signals (e.g., output signals 73A&B). Conventionally, a distributed power divider (e.g., circuit 70) comprises multiple output transmission lines (e.g., active ladder networks 75A&B) and a single input transmission line (e.g., active ladder network 75C), where: 1) one end of each transmission line is terminated (e.g., by shunt resistors R69A-C) in the characteristic impedance of each L-section, given by $R_{term}=\sqrt{L/C_{gm}}$; 2) the other (opposite) end of each transmission line is unterminated and used for accepting input signals or providing output signals; 3) the number of output transmission lines establishes the number of output signals that are separated out (split) from a single input signal (i.e., the power division ratio); 4) the relative number of active devices (i.e., gain cells) associated with each output transmission line determines the proportion with which the output signals are split from a single input signal; and 5) the total number of transmission lines (i.e., the number of input transmissions lines plus the number of output transmission lines) is equal to one more than the number of output signals.

Although distributed combiner 60 potentially can provide sufficient wideband operation for use in high-speed data converter applications, such a combiner suffers from at least two significant problems. One significant problem is that a conventional distributed combiner (e.g., combiner 60) is designed for use with matched impedance sources and loads, and the current sources and loads typically utilized in data converter applications have uncontrolled impedances (e.g., source and load impedances typically are not controlled to equal $R_{term}$). A second significant problem is that during the combining process of a conventional distributed combiner, one of the input signals gets appreciably phase shifted relative to any other input signal. In a conventional distributed combiner, the input signals are combined out-of-phase (i.e., combined with unequal phase shifts) because one input signal is subjected to the propagation delay of a larger number of L-sections than the other input signal (e.g., input signal 64A propagates to output 63A through a total of four L-sections, while input signal 64B propagates to output 63A though a total of only three L-sections). Conventionally, the amount of phase shift applied to any input signal is not considered a critical design parameter and is unconstrained. The present inventor has discovered that in high-speed data converter applications, the sampling skew resulting from out-of-phase signal combining introduces nonlinear distortion that degrades conversion precision.

Distributed networks have been utilized to extend the operating bandwidth of conventional apparatuses that perform the functions of signal amplification, power dividing, and power combining. Conventional use of distributed networks, however, has not resulted in a means of signal reconstruction (i.e., continuous-time summation) that exhibits the properties needed for time-interleaved, frequency-interleaved, or other parallel structures for D/A conversion. In high-speed D/A applications, conventional signal combiners suffer from one or more deficiencies related to signal attenuation, uncontrolled impedances, or out-of-phase combining. To support advances in analog and digital signal processing speeds, therefore, the need exists for a distributed signal reconstruction apparatus that offers a level of performance that is not possible through conventional means.

SUMMARY OF THE INVENTION

The present invention provides, among other things, improved signal reconstruction apparatuses for use in time-interleaved and/or frequency-interleaved D/A (digital-to-analog) conversion, and improved structures for distributed signal amplification and bandlimiting. Certain embodiments of the present invention utilize distributed networks to combine into a complete (composite) signal the multiple output signals of the parallel processing paths associated with: multi-stage noise shaping (e.g., conventional delta-sigma modulation), decomposition in time (e.g., conventional polyphase decomposition and time interleaving), and/or decomposition in frequency (e.g., conventional frequency interleaving). Compared to conventional circuits used for combining continuous-time signals (i.e., signal reconstruction), such as conventional power combiners, a distributed apparatus according to the preferred embodiments of the present invention, can provide effective signal reconstruction, and/or signal amplification, over very wide bandwidths and at very high frequencies. Therefore, such a distributed signal reconstruction apparatus can be particularly advantageous in applications requiring high-speed D/A conversion.

One specific embodiment of the invention is directed to an apparatus for combining multiple continuous-time signals into a single, composite signal, and includes: 1) a plurality of input lines for accepting a plurality of input signals; 2) a first ladder network having a first and a second terminal junction point, each of which is terminated in a characteristic impedance, and an outer junction point which is coupled to an input line and; 3) a second ladder network having a first and a second terminal junction point, each of which is terminated in a characteristic impedance, and a junction point which is coupled to an inner (interior) junction point of a first ladder network; and 4) and output line that is coupled to an inner (interior) junction point of a second ladder network. A ladder network comprises at least two reactive impedance segments (e.g., L-sections), and each segment includes at least one shunt capacitive element, as either an active (e.g., gain cell) or passive (i.e., capacitor) device, and at least one series reactance. The ladder networks preferably are grouped into controlled-impedance transmission paths, such that the total number of transmission paths is equal to the total number of input signals. In addition, each transmission path preferably has a lowpass or a bandpass frequency response, with an upper cutoff frequency that equals or exceeds a maximum operating frequency that is intended for the overall apparatus. Also, each of the input signals preferably has been generated from a common (reference) signal by decomposition in time and/or frequency, and as each of the input signals propagate from an input line to the output line, they pass through the same number and/or kind of reactive impedance segments. Therefore, except for any intentional gain adjustments, input signals are subjected to approximately equal delaying in time and approximately equal scaling in magnitude, as they are combined into a single composite signal (i.e., each input signal is subjected to an approximately equivalent frequency response as it propagates through the combiner).

A second specific embodiment of the invention is directed to an apparatus for combining multiple continuous-time signals into a single, composite signal, and includes: 1) a plurality of input lines for accepting a plurality of input signals; 2) a first ladder network having a first and a second terminal junction point, each of which is terminated in a characteristic impedance, and a junction point which is coupled to an input line; 3) a second ladder network having a first and a second terminal junction point, each of which is terminated in a characteristic impedance, and a junction point which is coupled to a junction point of a first ladder network; and 4) an output line that is coupled to a junction point of a second ladder network. A ladder network comprises at least two reactive impedance segments (e.g., L-sections), each of which includes at least one shunt capacitive element, as either an active (e.g., gain cell) and/or passive (i.e., capacitor) device, and at least one series reactance. In addition, each reactive impedance segment preferably has a frequency response with an upper cutoff frequency that equals or exceeds a maximum operating frequency that is intended for the overall apparatus. Each of the input signals preferably has been generated from a common (reference) signal by decomposition in time. As each of the input signals propagates from an input line to the output line, they pass through a number of reactive impedance segments which introduce an intentional time delay, such that: 1) different ones of the input signals are delayed in time by different amounts; and 2) the difference in delay between any two input signals is an integer multiple of a common delay increment. The common delay increment preferably is less than the period of an intended maximum operating frequency for the apparatus.

A third specific embodiment of the invention is directed to an apparatus for amplifying a continuous-time input signal, and includes: 1) an input line for accepting an input signal; 2) a first ladder network comprising a plurality of reactive impedance segments, with a first outer junction point coupled to the input line, a second outer (terminal) junction point terminated in a characteristic impedance, and at least one inner (interior) junction point; 3) a second ladder network comprising a plurality of reactive impedance segments, with a first outer (terminal) junction point terminated in a characteristic impedance, a second outer junction point, and at least one inner junction point; 4) at least one active element which couples an inner junction point of the first ladder network to an inner junction point of the second ladder network; and 5) an output line that is coupled to an outer junction point of the second ladder network. Each ladder network comprises at least two reactive impedance segments (e.g., L-sections), each of which includes at least one shunt reactance, formed by a parallel resonant circuit with either active (e.g., provided by a gain cell) and/or passive (e.g., provided by a discrete capacitor) capacitance, and at least one series reactance with inductance and/or capacitance. In addition, each ladder network preferably forms a controlled-impedance transmission path with a bandpass response, such that the passband of the bandpass response establishes the frequency range over which apparatus is intended to operate.

A continuous-time signal combiner, which incorporates any of the embodiments of the invention described above, typically can provide a better combination of the wide bandwidth and low signal attenuation needed for high-speed D/A converters incorporating time interleaving and/or frequency interleaving. Such a combiner, therefore, can have utility in various commercial, industrial and military applications where high-speed D/A conversion is utilized, including direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 2A is a diagram of a conventional, continuous-time circuit that uses resistive elements to combine two input signals into one output signal; and FIG. 2B is a diagram of a conventional, continuous-time circuit that uses a transformer to combine two input signals into one output signal.

FIG. 3A is a circuit diagram of an artificial transmission line comprising multiple reactive impedance segments, with a series inductor as the first reactive element; and FIG. 3B is a circuit diagram of an artificial transmission line comprising multiple reactive impedance segments, with a shunt capacitor as the first reactive element.

FIG. 4A is a diagram of a conventional, continuous-time circuit that utilizes reactive impedance networks with a resistive coupling element, to combine two input signals into one output signal; and FIG. 4B is a diagram of a conventional, continuous-time circuit that utilizes reactive impedance networks with inductive coupling elements to combine two input signals into one output signal.

FIG. 6A is a circuit diagram of a conventional gain cell comprising an active device in a common-source configuration; FIG. 6B is a circuit diagram of a conventional gain cell comprising two active devices in a cascode configuration, with gain control provided by a variable gate bias voltage; FIG. 6C is a circuit diagram of a gain cell comprising two active devices and reactive elements in a broadband cascode configuration, with gain control provided by a variable gate bias voltage; and FIG. 6D is a circuit diagram of a gain cell comprising three active devices and reactive elements, in a configuration which provides both gain control and delay control through independent gate bias voltages.

FIG. 7C is a diagram of a distributed combiner according to a representative embodiment of the invention, in which there is an even number of input signals that are combined into a single output signal, each input signal is subjected to an approximately equivalent lowpass response, and some input signals propagate through a common controlled-impedance path that is comprised of an array of active ladder networks.

DESCRIPTION OF THE PREFERRED EMBODIMENT(S)

Conventional methods, such as parallel processing, have been developed that allow modern signal processors to operate at effective rates which exceed the limitations of constituent components. The present inventor has discovered that the effectiveness of the time interleaving, frequency interleaving, and/or noise shaping techniques, utilized by conventional digital-to-analog converters, depends on the availability of suitable methods for reconstructing an output signal from the multiple parallel inputs generated by a parallel processor. The present inventor further has discovered that distributed networks can be used to create novel structures for the summation of continuous-time signals and/or the amplification of bandpass signals. In particular, these novel structures often can overcome the performance limitations of conventional power combiners, including those limitations related to bandwidth, signal attenuation, and delay/phase variation.

Figure 1A:
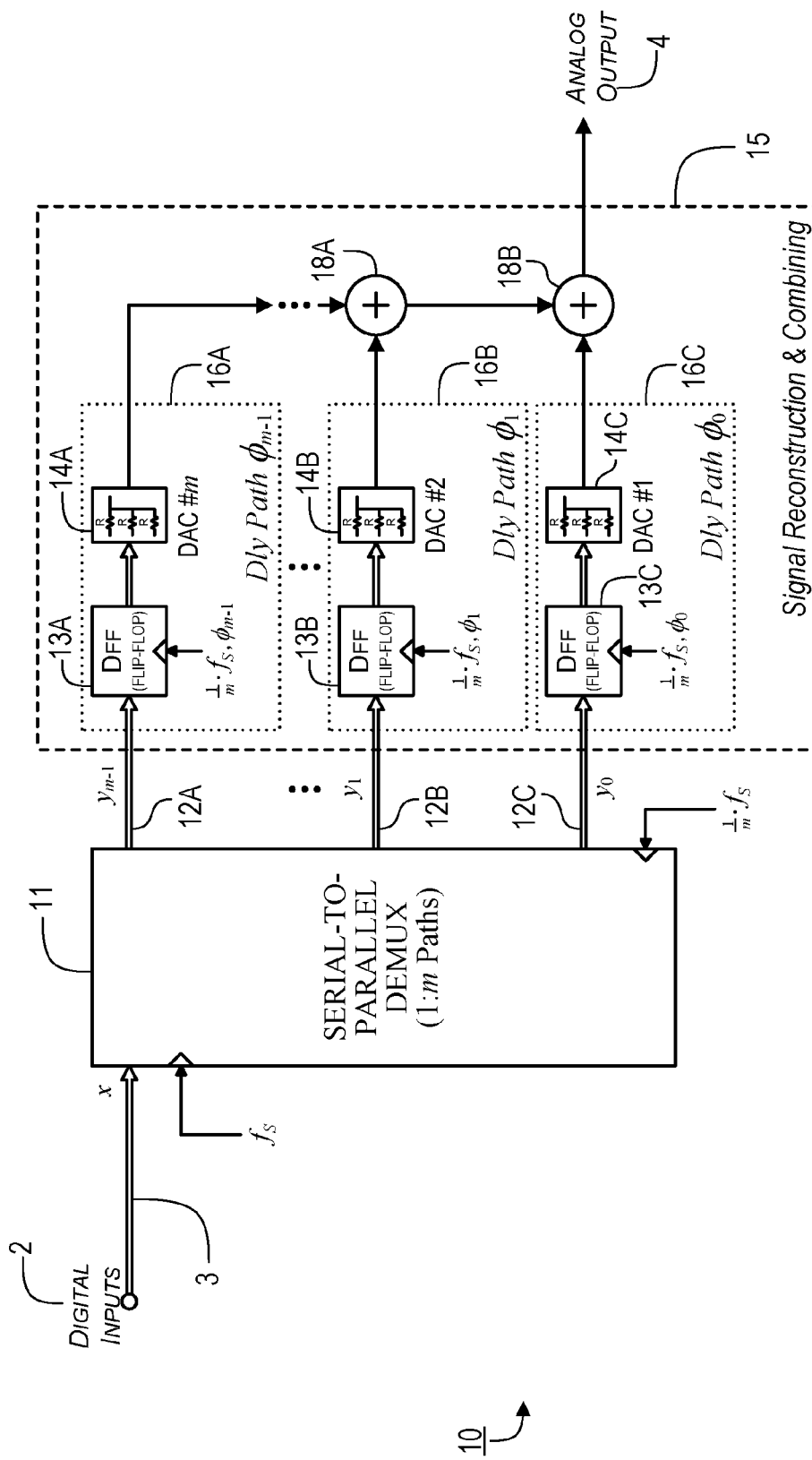
FIG. 1A is a block diagram of a conventional digital-to-analog converter that utilizes continuous-time summation to combine parallel signals which are generated through interleaving in time.
Figure 1B:
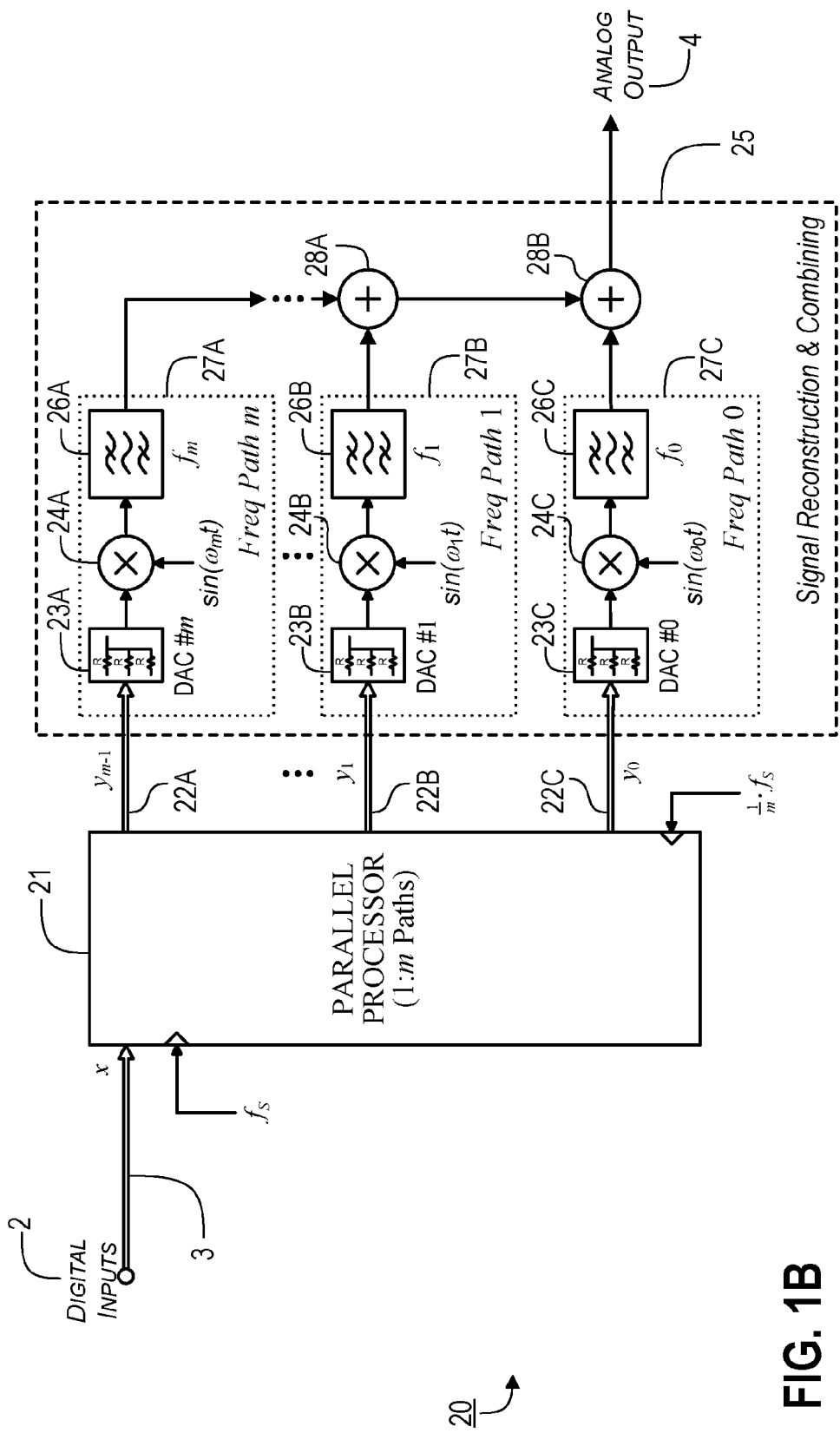
FIG. 1B is a block diagram of a conventional digital-to-analog converter that utilizes continuous-time summation to combine parallel signals which are generated through interleaving in frequency.
Figure 1C:
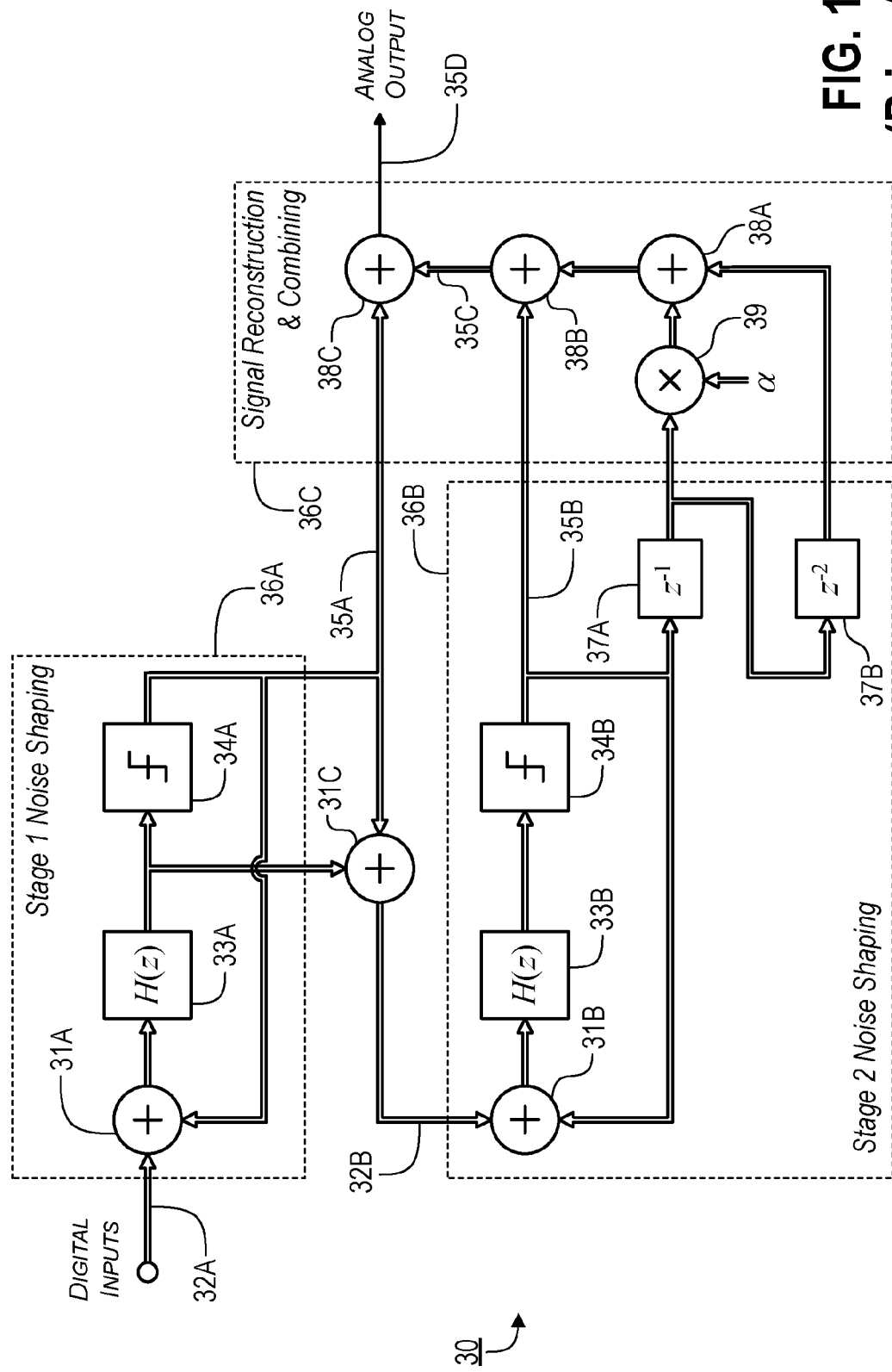
FIG. 1C is a block diagram of a conventional digital-to-analog converter that utilizes continuous-time summation to combine parallel signals which are generated through multi-stage noise shaping.
Figure 5A:
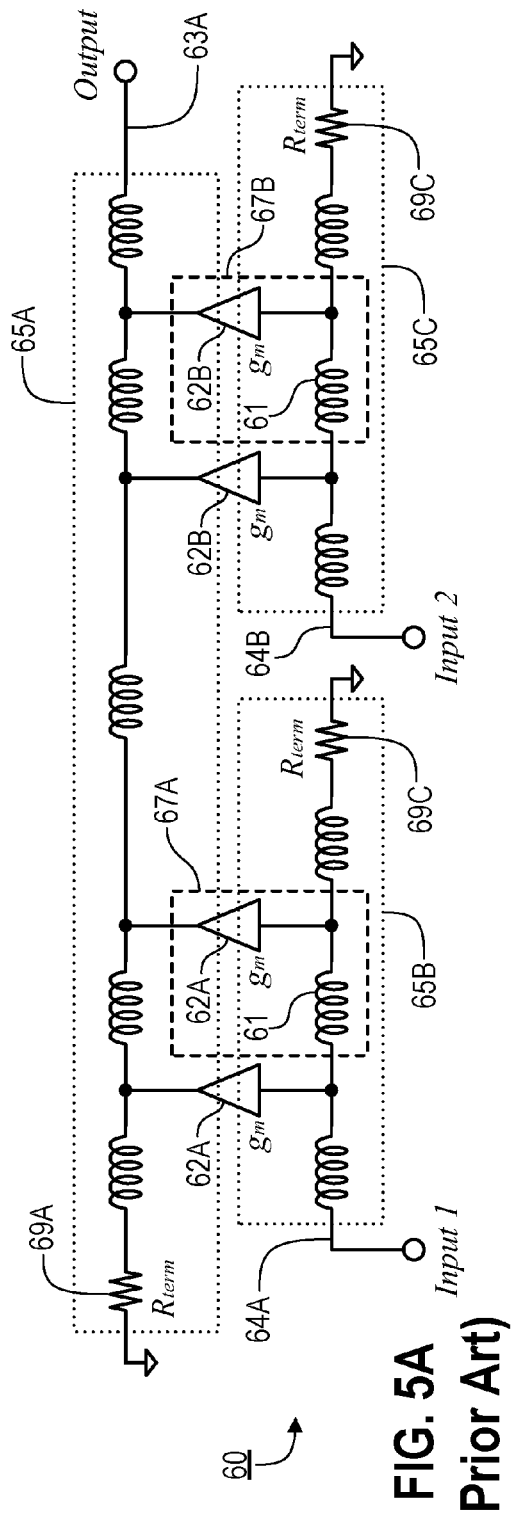
FIG. 5A is a diagram of a conventional, continuous-time circuit which utilizes multiple artificial transmission lines with active coupling elements, to combine two input signals into one output signal.
Figure 5B:
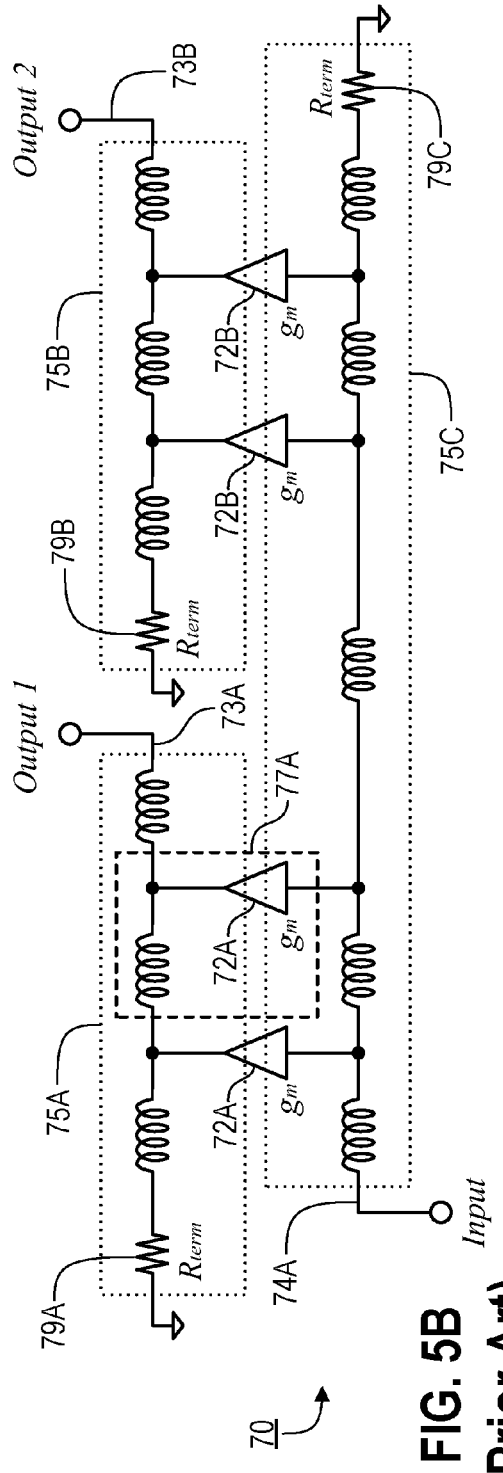
FIG. 5B is a diagram of a conventional, continuous-time circuit which utilizes multiple artificial transmission lines with active coupling elements, to distribute a single input signal to two different output lines.
Figure 7A:
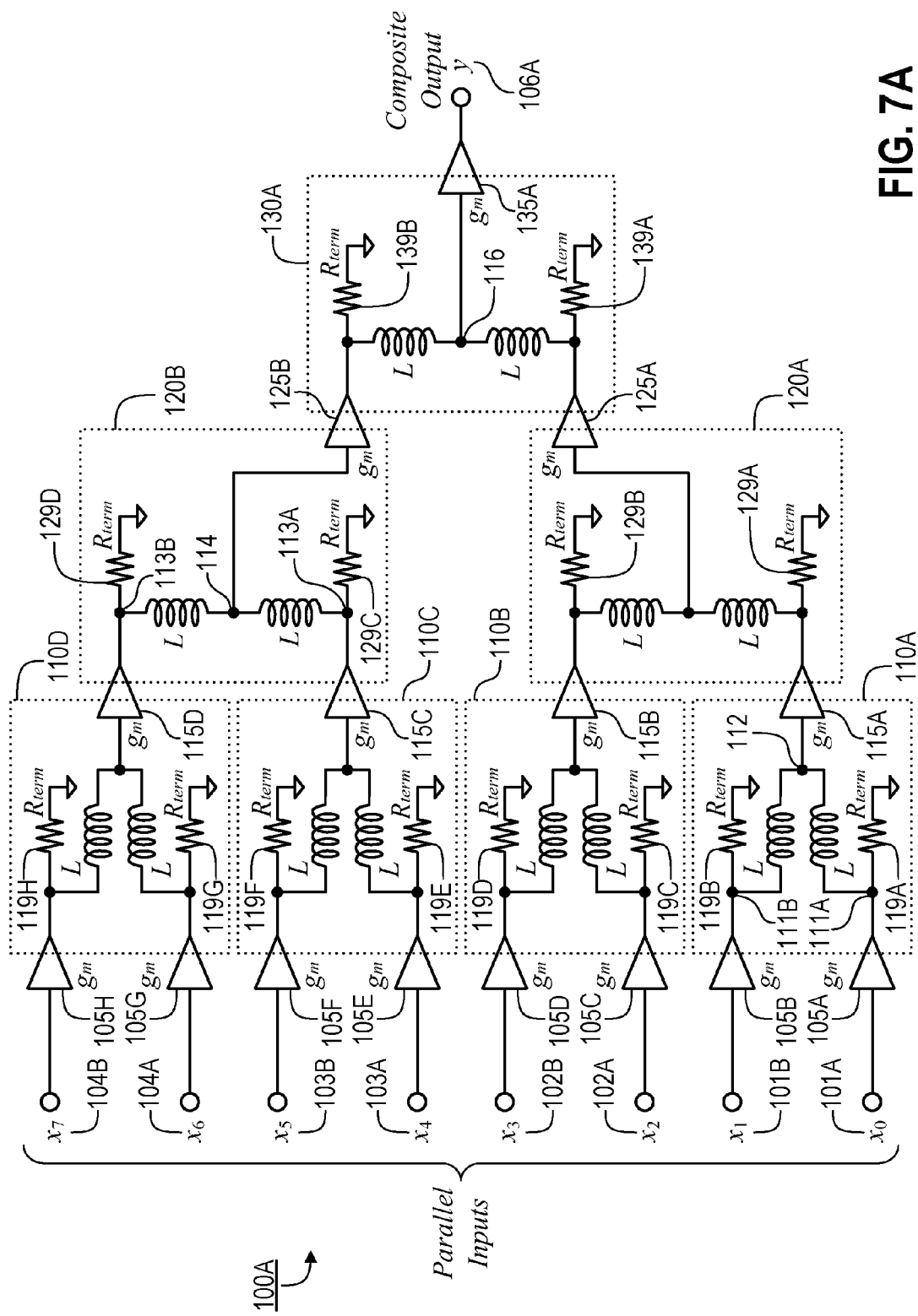
FIG. 7A is a diagram of a distributed combiner according to a representative embodiment of the invention, in which there is an even number of input signals that are combined into a single output signal, each input signal is subjected to an approximately equivalent lowpass response, and each input signal propagates through a different controlled-impedance path that is comprised of an array of active ladder networks.

A simplified block diagram of an improved signal combiner 100A according to certain preferred embodiments of the invention is illustrated in FIG. 7A. Distributed combiner 100A provides a continuous-time composite output signal 106A, utilizing seven active ladder networks (e.g., 110A-D, 120A&B and 130A) to sum together eight continuous-time input signals (e.g., 101A&B, 102A&B, 103A&B, and 104A&B). More generally, a distributed combiner according to certain representative embodiments preferably comprises N−1 active ladder networks, where N is the number of parallel input signals that are summed together. Preferably, each such active ladder network comprises at least two reactive impedance segments (i.e., L-sections). Each reactive impedance segment includes a shunt capacitance $C_{gm}$, which is derived from an active (e.g., the intrinsic input and/or output capacitance of a gain cell) or passive (e.g., capacitor) device, in addition to a discrete series inductor L. Outer junction points, preferably located at the terminal end of each active ladder network, are coupled to input signals (e.g., input signals 101A&B couple into active ladder network 110A at outermost junction points 111A&B, respectively) and are terminated in a characteristic impedance given by $R_{term} = \sqrt{\Sigma L / \Sigma C_{gm}}$, where $\Sigma L$ and $\Sigma C_{gm}$ are the total series inductance and total shunt capacitance, respectively, of the corresponding ladder network (e.g., active ladder network 110A is terminated at terminal junction points 111A&B by shunt resistors 119A&B, respectively). In alternate embodiments, however, input signals can be coupled to outer junction points which are not the outermost (terminal) junction points. In addition, the preferred embodiments are such that an inner (interior) junction point of each active ladder network (i.e., a junction point located between the outer junction points) provides an output line/node, which preferably is coupled to the outermost (terminal) junction point of a second active ladder network (e.g., inner junction point 114 is coupled to terminal junction point 113B of active ladder network 120B), or otherwise is coupled to the output of the combiner (e.g., inner junction point 116 of active ladder network 130A is coupled to output 106A). In alternate embodiments, however, the output lines of a first active ladder network are coupled to outer junction points of a second ladder network which are not terminal junction points. Those skilled in the art will readily appreciate that the gain cells (e.g., transconductance stages 105A-H, 115A&B, and 135A) associated with any of the reactive impedance segments (i.e., L-sections) can be implemented using various conventional topologies, including any of the conventional topologies illustrated in FIGS. 6A-D. Embodiments employing gain cells of various topologies should also be considered within the scope of the invention. As used herein, the term "coupled", or any other form of the word, is intended to mean either directly connected or connected through one or more other elements, such as reactive impedance segments, passive elements, gain cells, or other processing blocks, e.g., for the purpose of signal conditioning.

In the representative embodiment of combiner 100A, input signals are summed in approximately equal proportion to produce output 106A (i.e., input signals are combined with approximately equal phase shift and magnitude scaling). Exemplary applications for representative combiner 100A are those where input signals are intended to have equal weights, such as input signals derived from: 1) the different bits from the output of a D/A converter which employs unary (i.e., thermometer) encoding; and 2) the different outputs from the parallel paths of a D/A converter which employs frequency interleaving (i.e., frequency decomposition). In the preferred embodiments of the present invention, therefore, each input signal (e.g., input signals 101A&B, 102A&B, 103A&B, and 104A&B) passes through the same number and same kind of reactive impedance segments as it propagates through a controlled-impedance transmission path to the output of the combiner (e.g., to become part of the composite output 106A). The transfer functions from the inputs to the output of the combiner are substantially identical (i.e., the various controlled-impedance transmission paths through which input signals propagate have substantially identical transfer functions). In alternative embodiments, however, the transfer functions from each input signal to the output of the combiner are only approximately equal. Applying the principle of superposition to ladder network 110A of combiner 100A, those skilled in the art can appreciate that the voltage $v_T(s)$ at inner junction point 112 is given by $$v_T(s) = g_m \cdot H_{LP}(s) \cdot v_0(s) + g_m \cdot H_{LP}(s) \cdot v_1(s)$$
$$= g_m \cdot H_{LP}(s) \cdot (v_0(s) + v_1(s)),$$

where: 1) s is the Laplace variable, which can represent a complex angular frequency; 2) $g_m$ is the transconductance of each of gain cells 105A&B; 3) $v_0(s)$ and $v_1(s)$ are the input voltage waveforms on lines 102A&B, respectively; and 4) $H_{LP}(s)$ is the (lowpass) transfer function from an input junction point to an output junction point (e.g., the transfer function from either of terminal junction points 111A&B to inner junction point 112). Therefore, the signal at inner (output) junction point 112 of ladder network 110A is proportional to the sum of input signals 101A&B. The transfer function $H_{LP}(S)$ derives from the series inductance (L) and shunt capacitance ($C_{gm}$) of each reactive impedance segment (e.g., an L-section comprising a discrete inductor and the intrinsic capacitance at the input of a gain cell in the representative embodiment of combiner 100A), such that the transfer function introduces a lowpass response with upper cutoff frequency $$f_L \approx \frac{1}{\pi\sqrt{LC_{gm}}}$$

and group delay $$t_{PD} = \sqrt{LC_{gm}}.$$

In the preferred embodiments, it can be shown that the voltage $v_T(s)$ at output 106A is given by $$v_T(s) = g_m^{log_2 N + 1} \cdot H_{LP}^{log_2 N}(s) \cdot \sum_{i=1}^{N} v_i(s),$$

where: 1) $v_i(s)$ is the voltage waveform at the $i^{th}$ input; 2) the variable N is equal to the number of input signals (i.e., the N=8 input signals propagate through a total number of L-sections equal to $log_2 N$); and 3) $H_{LP}(s)$ is the transfer function from an input junction point of any active ladder network to the output junction point of the same active ladder network (e.g., the response of the L-section with outermost junction point 113A and inner junction point 114). As a result, input signals are combined in equal proportion, and the combining process does not cause one input signal to be phase shifted, or time delayed, by an amount which is different from any other input signal.

Figure 7B:
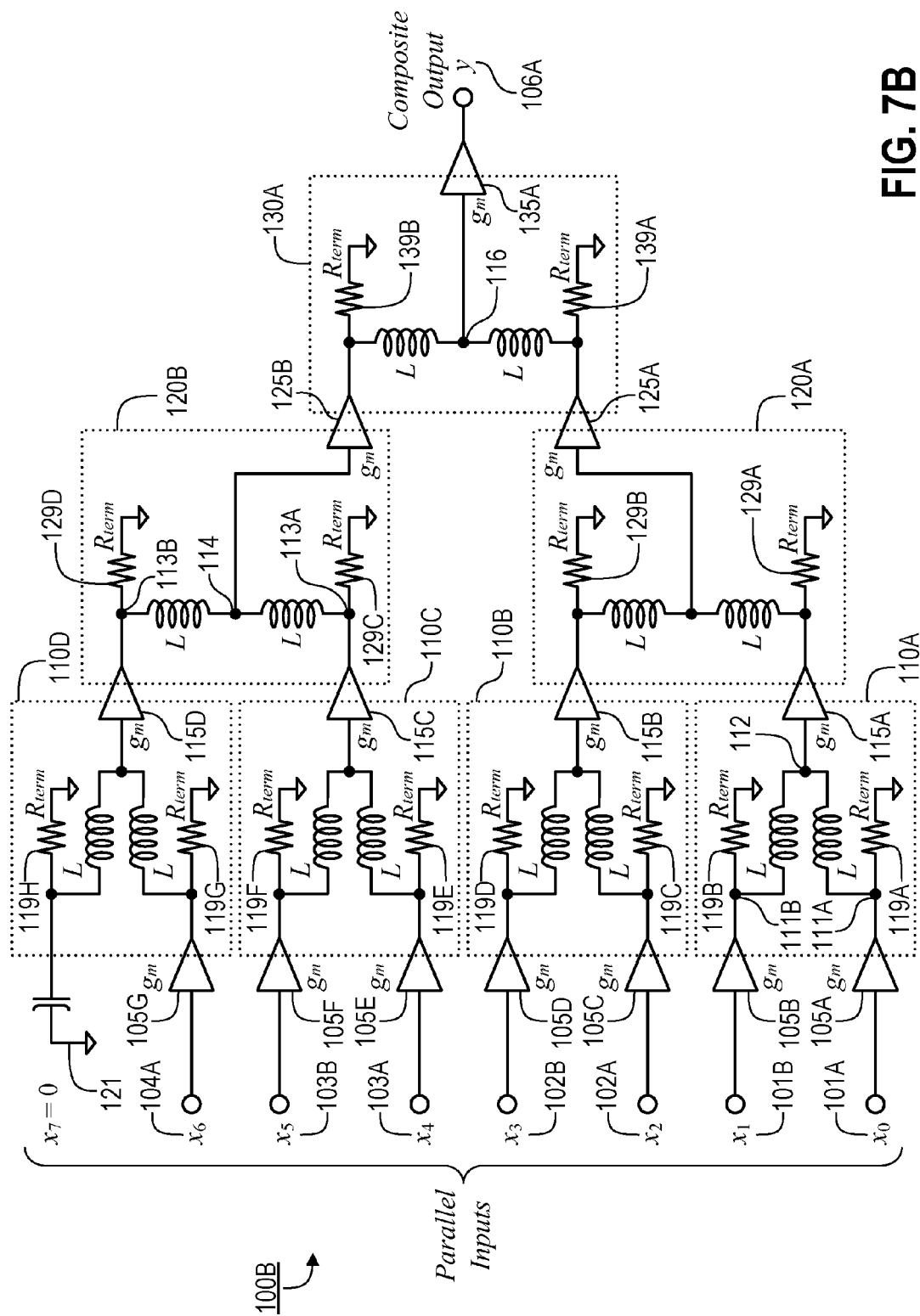
FIG. 7B is a diagram of a distributed combiner according to another representative embodiment of the invention, in which there is an even number of input signals that are combined into a single output signal, each input signal is subjected to an approximately equivalent lowpass response, and each input signal propagates through a different controlled-impedance path that is comprised of an array of active ladder networks.

In the representative embodiment of combiner 100A, there is an even number of input signals that are combined, and the number of input signals intended to be combined is equal to the total number of active ladder networks. Furthermore, each input signal propagates to the combiner output through a unique controlled-impedance transmission path (i.e., a unique set of L-sections associated with the various active ladder networks), such that the number of controlled impedance transmission paths is equal to the number of input signals. It should be noted that in certain alternative embodiments, however, an odd number of input signals are intended to be combined. In such an alternative embodiment, one of the input gain stages (e.g., one of transconductance stages 105A-H) preferably is configured for zero transconductance (i.e., a gain of zero). More preferably, an odd number of input signals are combined according to the representative embodiment of combiner 100B, shown in FIG. 7B. In combiner 100B, one of the ladder networks is coupled to a single input signal (e.g., only input signal 104A is coupled to ladder network 110D), such that what would have been an eighth input signal at node 121, is equal to zero. In the representative embodiment of combiner 100B, the shunt capacitance at junction point 121 is provided by a discrete capacitor, rather than by the intrinsic output capacitance of a gain cell. In other alternate embodiments, such as representative combiner 100C of FIG. 7C, the number of active ladder networks is less than the number of input signals intended to be combined. In combiner 100C, each of the outer junction points (e.g., junction points 117A&B) of ladder networks 140A-C are coupled to two input signals, such that the shunt capacitance at each of these outer junction points is equal to $2 \cdot C_{gm}$, where $C_{gm}$ is the intrinsic output capacitance of a gain cell (e.g., gain cells 145E). The arrangement of ladder network 150A differs from that of ladder networks 140A-C, in that two input signals (e.g., the outputs of gains cells 165A&B) are coupled to outer junction point 123B, while only one input signal (e.g., the output of gain cell 155A) is coupled to outer junction point 123A. So that each of the input signals is subjected to the same transfer function as they propagate through ladder network 150A, a discrete capacitor (e.g., capacitor 126) with capacitance equal to $C_{gm}$ preferably is coupled to junction point 123A of representative combiner 100C, so that the total shunt capacitance at junction point 123A equals the total shunt capacitance at junction point 123B. In alternate embodiments, however, discrete capacitor 126 is absent and instead, the intrinsic output capacitance of each of gains cells 165A&B preferably is half that of gain cell 155A (i.e., the combined intrinsic output capacitance of gain cells 165A&B preferably is equal to the intrinsic output capacitance of gain cell 155A). As a result, combiner 100C utilizes only four active ladder networks to combine a total of twelve input signals (e.g., input signals 101A&B, 102A&B, 103A&B, 104A&B, 107A&B, and 108A&B), and N=12 input signals propagate through a number of L-sections which is less than $log_2$ N. Those skilled in the art will readily appreciate other arrangements are possible, which comprise different numbers of input signals, active ladder networks, and propagation paths. Such alternate arrangements should be considered within the scope of the invention.

Although input signals are combined in equal proportions in the embodiments of combiners 100A-C, in other embodiments input signals can be intentionally combined in unequal proportions. In certain alternate embodiments, for example, the input signals represent the different bits of a binary encoded signal, in which case input signals preferably are combined according to a binary weighting technique. One way to effect a binary weighting in the summation of the input signals, is to appropriately scale the transconductance ($g_m$) values of certain active devices within the combiner network. In particular, input signals are combined according to a binary weighting when: 1) the transconductances of initial gain cells 105A-F are unequal; and 2) the ratio between the transconductance of any two initial gain cells is a power of two. In still other embodiments, including those where conventional multi-stage noise shaping (e.g., a parallel MASH arrangement) is employed, the input signals may represent the time-delayed outputs of a delta-sigma (ΔΣ) modulator, and combiner 100A (or a portion of combiner 100A) is intended to implement a noise cancellation filter. For example, a conventional second-order noise cancellation filter has a transfer function H(z) which is given by $$H(z)=1+\alpha \cdot z^{-1}+z^{-2},$$

where: 1) α is a variable that depends on the frequency band processed by the ΔΣ modulator; and 2) z is the Z-transform variable representing a delay of one sample period. Those skilled in the art can readily appreciate that the output of such a noise cancellation filter is generated by combining (summing): 1) a current output sample which reflects a magnitude scaling of unity (i.e., no scaling) and no time delay; 2) a prior output sample which reflects a magnitude scaling of α and a time delay of one sample period (i.e., $z^{-1}$), and 3) a prior output sample which reflects a magnitude scaling of unity and a time delay of two sample periods (i.e., $z^{-2}$). Therefore, in embodiments where combiner 100A, or a portion of combiner 100A, is intended to implement a noise cancellation filter at the output of a ΔΣ modulator, input signals preferably are combined according to a weighting which reflects the coefficients of the noise cancellation filter (e.g., a weighting of 1, α, and 1 for a second-order filter).

Figure 8A:
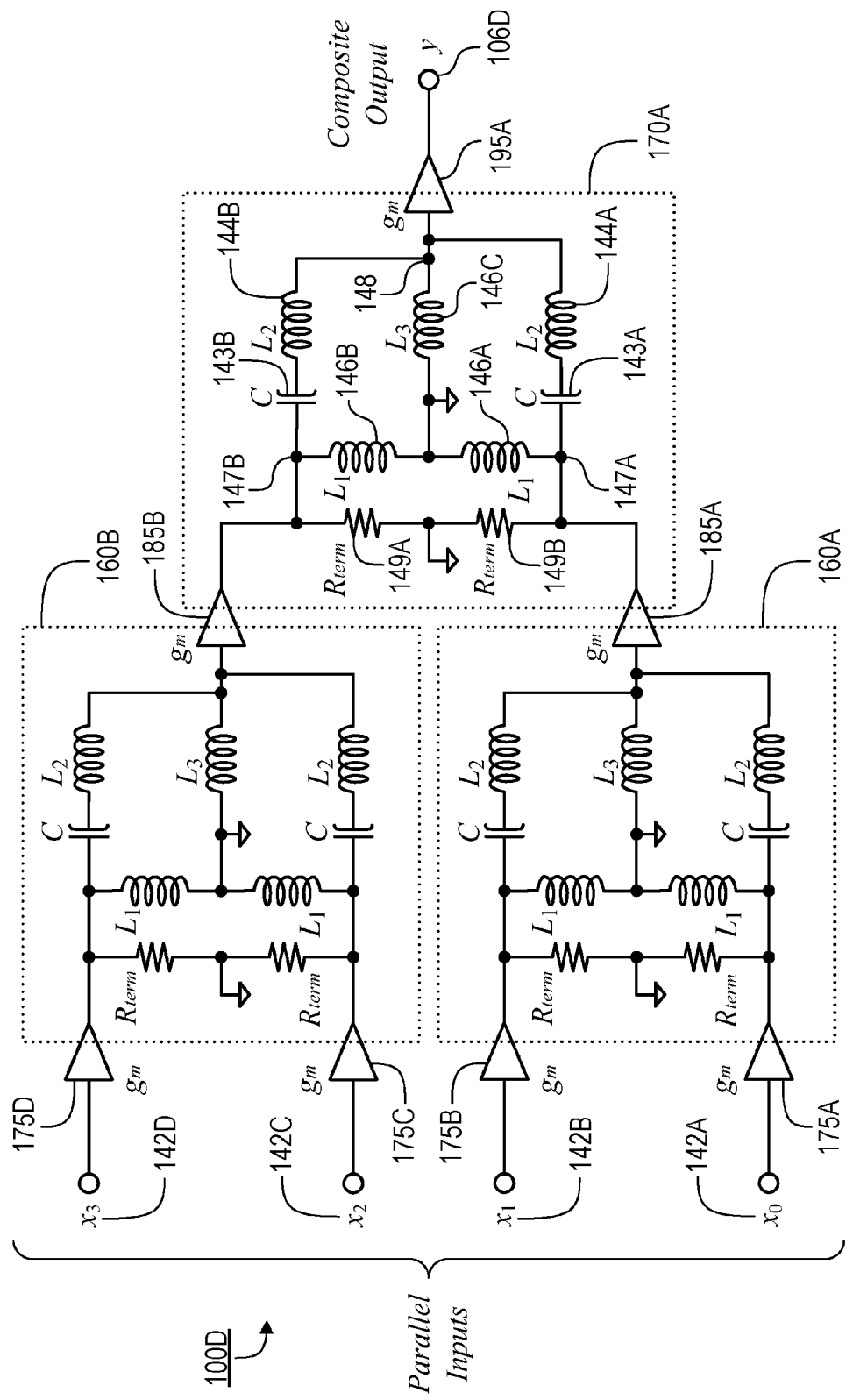
FIG. 8A is a diagram of a distributed combiner according to a representative embodiment of the invention, in which there is an even number of input signals that are combined into a single output signal, each input signal is subjected to an approximately equivalent bandpass response, and each input signal propagates through a different controlled-impedance path that is comprised of an array of active ladder networks.
Figure 8B:
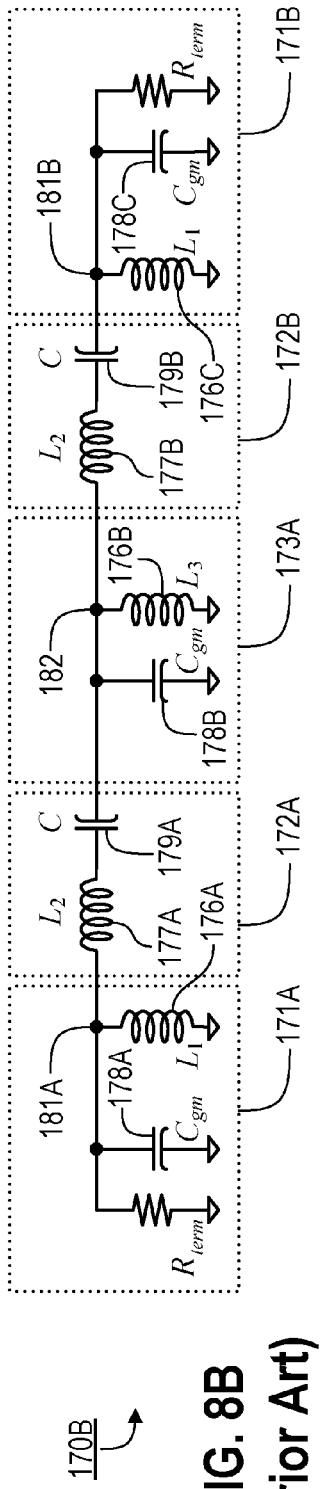
FIG. 8B is a block diagram of a conventional bandpass filter prototype in which there is an even number of input signals that are combined into a single output signal, each input signal is subjected to an approximately equivalent lowpass response, and each input signal propagates through a different physical path comprising an array of active ladder networks, in an arrangement where shunt reactances, formed by parallel resonators, are coupled to each other by series resonators.
Figure 8C:
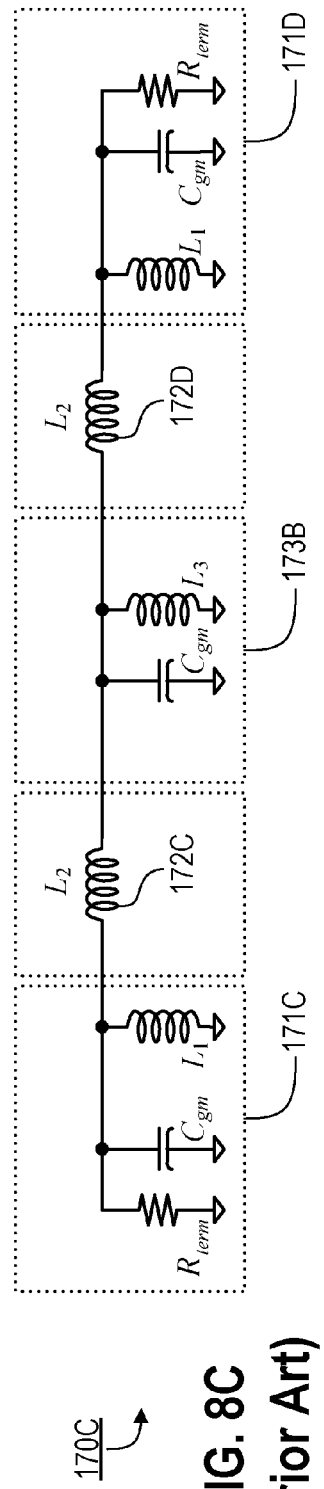
FIG. 8C is a diagram of a conventional bandpass filter prototype comprising multiple ladder networks, in an arrangement where shunt reactances, formed by parallel resonators, are coupled to each other by series inductive elements.
Figure 8D:
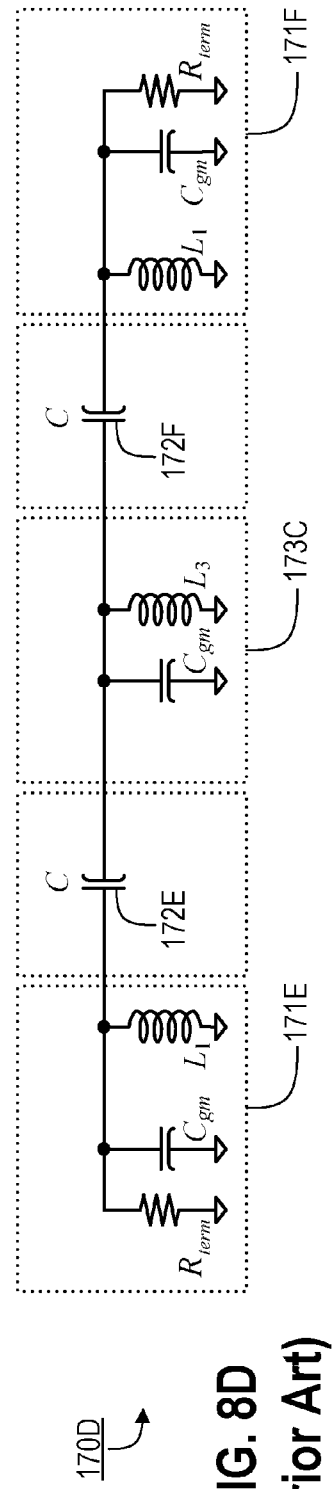
FIG. 8D is a block diagram of a conventional bandpass filter prototype comprising multiple ladder networks, in an arrangement where shunt reactances, formed by parallel resonators, are coupled to each other by series capacitive elements.

Combiner 100D shown in FIG. 8A can be used, e.g., for combining the outputs of a noise cancellation filter. In addition to scaling the magnitudes of input signals according to the coefficients of a desired noise-cancellation filter (e.g., relative scaling within the initial transconductance cells 175A-D), input signals are subjected to a bandpass response, instead of a lowpass response (e.g., as in combiner 100A) as they propagate though the controlled-impedance transmission paths which are formed by the various L-sections within preferred combiner 100D. In combiner 100D, a bandpass response is preferred to a lowpass response, because a bandpass response often can attenuate more of the shaped noise at the output of the noise cancellation filter. In the preferred embodiments, the bandpass response applied to an input signal is identical, or nearly identical, to the bandpass response applied to any other input signal, and the center of the bandpass response corresponds to a frequency where the intended noise cancellation filter has maximum attenuation (i.e., the center of the bandpass response is aligned with the stopband of the intended noise cancellation filter). Each of the active ladder networks within exemplary combiner 100D (e.g., ladder networks 160A&B and 170A) derives from a bandpass filter prototype, such as conventional bandpass filter 170B shown in FIG. 8B. For example, conventional bandpass filter 170B compares to active ladder network 170A as follows: 1) series inductors 177A&B of bandpass filter 170B correspond to series inductors 144A&B of ladder network 170A; 2) shunt inductors 176A-C of bandpass filter 170B correspond to shunt inductors 147A-C of ladder network 170A; 2) series capacitors 179A&B of bandpass filter 170B correspond to series capacitors 143A&B of ladder network 170A; 4) shunt capacitors 178A&C of bandpass filter 170B correspond to the intrinsic output capacitances of gain cells 185A&B of ladder network 170A; and 5) shunt capacitor 178B of bandpass filter 170B corresponds to the intrinsic input capacitance of gain cell 195A of ladder network 170A. It should be noted that although the active ladder networks of exemplary combiner 100D derive from a bandpass filter prototype where the shunt reactances, formed by parallel resonant circuits, are coupled to each other via series resonant circuits (e.g., shunt reactances 171A&B and 173A of filter 170B, are coupled by series reactances 172A&B), other prototype filter arrangements can be utilized and should be considered within the scope of the invention. For example, filter 170C (shown in FIG. 8C) is a conventional bandpass filter in which the shunt reactances, formed by parallel resonant circuits, are inductively coupled (e.g., shunt reactances 171C&D and 173B are coupled to each other by inductors 172C&D); and filter 170D (shown in FIG. 8D) is a conventional bandpass filter in which the shunt reactances, formed by parallel resonant circuits are capacitively coupled (e.g., shunt reactances 171E&F and 173C are coupled to each other by capacitors 172E&F).

Figure 8E:
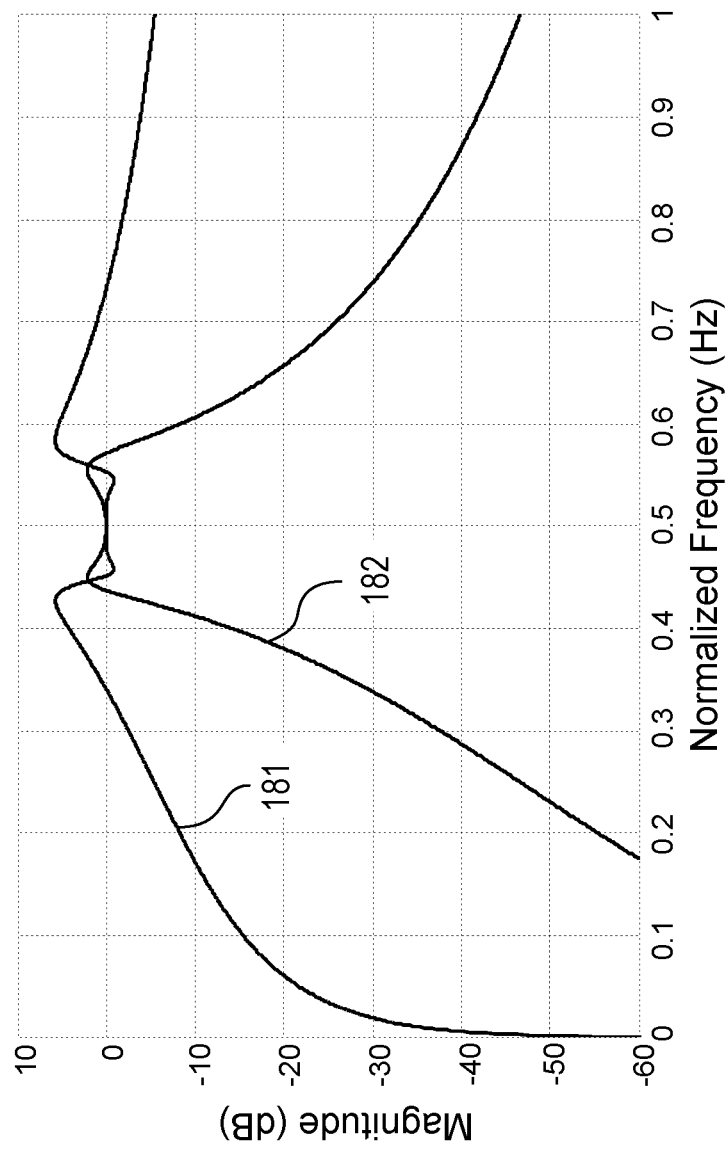
FIG. 8E is a graph showing the bandpass responses at the inner and outer nodes of a distributed combiner according to certain representative embodiments of the invention.

In the preferred embodiments of combiner 100D, it can be shown that the voltage $v_T(s)$ at output 106D is given by $$v_T(s) = H_{BP}^{log_2 N}(s) \cdot \sum_{i=1}^{N} A_i \cdot v_i(s),$$

where: 1) $v_i(s)$ is the voltage waveform at the $i^{th}$ input; 2) $A_i$ is the overall gain associated with the $i^{th}$ input signal (i.e., $A_i=\Pi g_m$ for the $i^{th}$ transmission path; 3) the variable N is equal to the number of input signals (i.e., the N=4 input signals propagate through a total number of L-sections equal to $log_2$ N); and 3) $H_{BP}(s)$ is the bandpass transfer function from an input junction point of any active ladder network (e.g., the response of the L-section with outermost junction point 147A and inner junction point 148). Input signals are combined in unequal proportion (e.g., according to $A_i$ which depend on the coefficients of a noise cancellation filter), but otherwise, are subjected to identical frequency responses in the combining process (i.e., signals are subjected to a frequency response established by $H_{BP}(s)$). The bandpass response $H_{BP}(s)$ is a function of the inductances and capacitances of the reactive impedance segments, and for a $5^{th}$-order Butterworth prototype, the transfer function $H_{BP}(s)$ has a bandwidth ($f_B$) of $$f_B \approx \frac{1}{\pi \cdot C'_{gm} \cdot R_{term}}$$

and a center frequency ($f_C$) equal to $$f_C = \frac{1}{2\pi \sqrt{LC'_{gm}}},$$

where $C'_{gm}$ is the shunt capacitance at the inner junction point of an active ladder network (e.g., the intrinsic input capacitance of gain cell 165B of active ladder network 170A). Exemplary magnitude versus frequency responses for combiner 100D are given in FIG. 8E. Curve 181 shows the frequency-dependent magnitude of the voltage produced at an outer junction point in response to a current applied at the same outer junction point (e.g., the voltage at outer junction point 147A, of ladder network 170A, in response to a current from the output of transconductance cell 185A). Curve 182 shows the frequency-dependent magnitude of a the voltage produced at an inner junction point in response to a voltage applied at an outer junction point (e.g., the voltage at inner junction point 148, of ladder network 170A, in response to a voltage applied at outer junction point 147A).

Figure 9A:
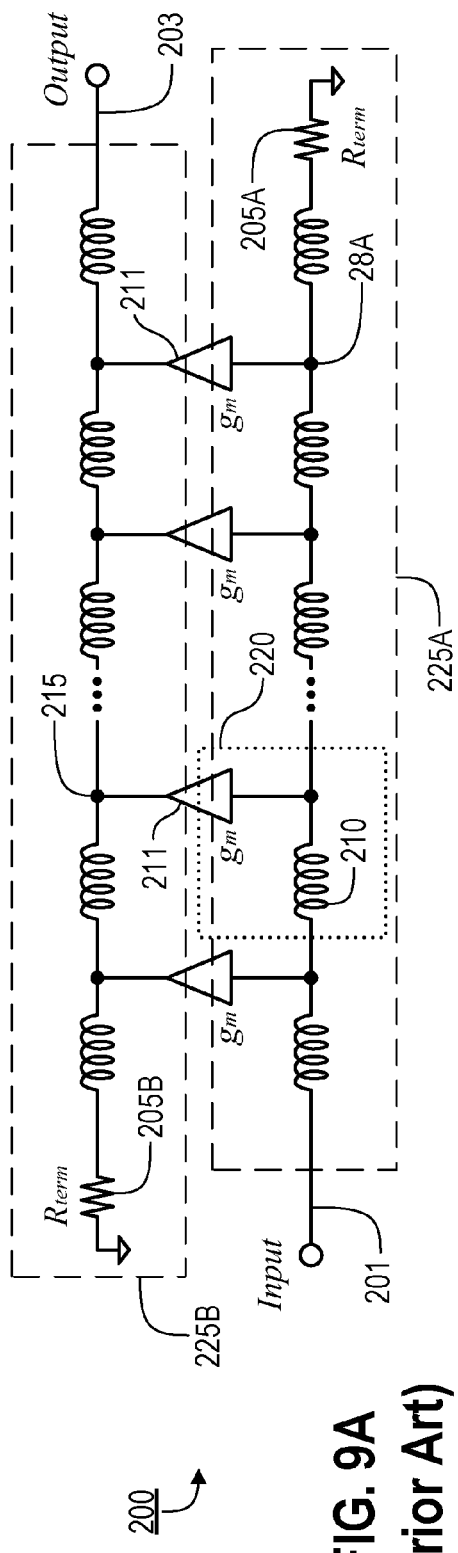
FIG. 9A is a diagram of a conventional distributed amplifier, which produces a lowpass response, and comprises an input transmission line, an output transmission line, and multiple gain cells.
Figure 9B:
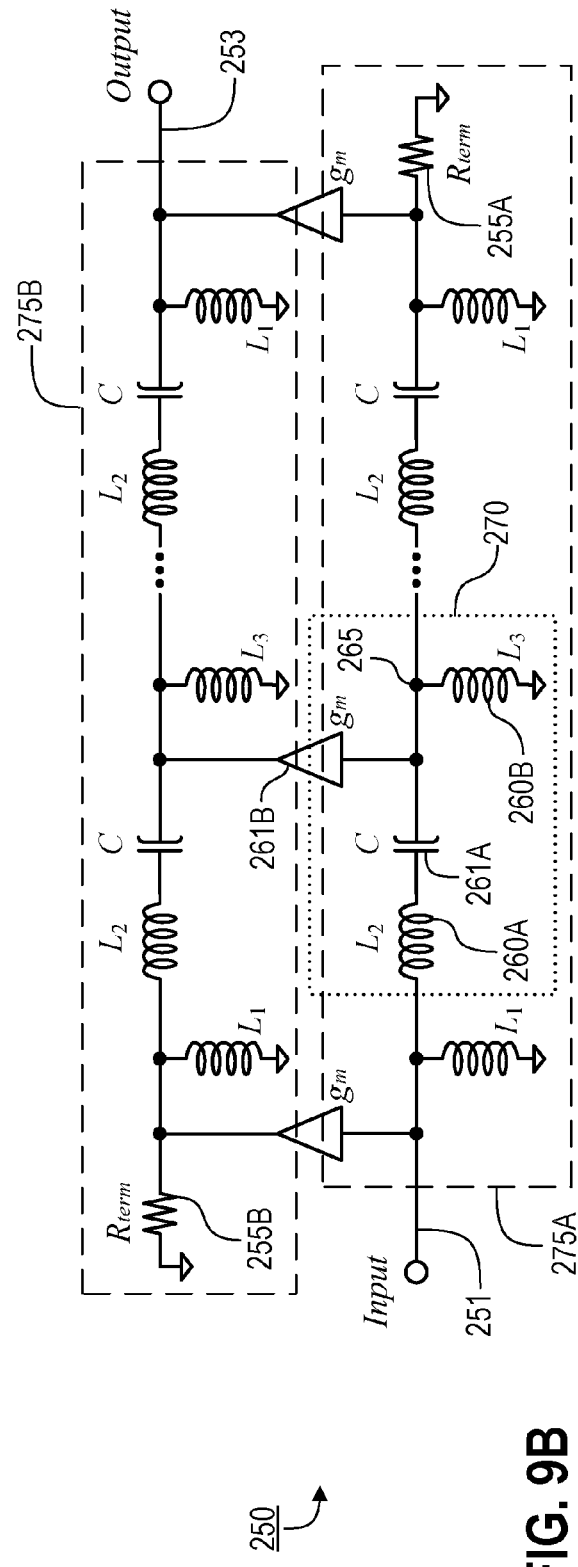
FIG. 9B is a diagram of a distributed amplifier according to certain embodiments of the invention, which produces a bandpass response, and comprises an input ladder network, an output ladder network, and multiple gain cells.

The general principles governing the operation of distributed combiner 100D also can be applied to novel methods for distributed amplification. Conventional distributed amplifiers, such as amplifier 200 of FIG. 9A, are based on artificial transmission lines with a lowpass response. A conventional distributed amplifier, such as amplifier 200 of FIG. 9A, overcomes the problem of gain-dependent bandwidth using a combination of two tactics: 1) high-gain operation is realized by summing the outputs of multiple low-gain amplifiers (e.g., gain cells 211) to mitigate the Miller effect; and 2) the high-frequency degradation caused by additive capacitance is mitigated by grouping discrete inductors with the intrinsic capacitances of active devices to form the reactive impedance segments of an "artificial" transmission line (e.g., inductor 210 is grouped with the intrinsic input capacitance of gain cell 211 to form L-section 220 of input transmission line 225A). The term "artificial" transmission line conventionally is used to describe a ladder network consisting of concatenated inductor-capacitor sections (e.g., L-sections 220), because such a structure approximates the general all-pass properties of an actual transmission line (e.g., characteristic impedance, propagation delay, minimal bandlimiting, etc.). The overall bandwidth $f_B$ of amplifier 200 is independent of the number of L-sections, and is determined approximately by the inductance and capacitance associated with each L-section according to $$f_B \approx \frac{1}{\pi \sqrt{LC_{gm}}},$$

where: 1) L is the total inductance associated with each L-section (e.g., from discrete inductor 210); and 2) $C_{gm}$ is the shunt capacitance associated with each L-section (e.g., from the intrinsic input capacitance of gain cell 211). Furthermore, the overall (voltage) gain $A_V$ of amplifier 200 increases linearly as the number of distributed stages increases, according to $$A_V = \frac{1}{2} \cdot n \cdot g_m \cdot R_{term},$$

where: 1) n is the number of L-sections (i.e., the number of gain cells); 2) $g_m$ is the transconductance associated with each gain cell; and 3) $R_{term} = \sqrt{L/C_{gm}}$ is the terminating resistance for an artificial transmission line. Therefore, the gain of amplifier 200 is independent of bandwidth, and depends only on the number gain cells within the distributed ladder network (i.e., the number of gain stages associated with an artificial transmission line).

By using distributed networks based on bandpass filter prototypes, instead of artificial transmission lines, the inventor has discovered that a comparable gain benefit can be obtained with the added benefit of improved bandlimiting. An example is distributed amplifier 250 of circuit 9B, which, compared to conventional amplifier 200, offers improved bandlimiting. According to the preferred embodiments, amplifier 250 realizes improved bandlimiting through utilization of L-sections (e.g., L-section 270), which have been modified such that: 1) shunt capacitive elements (e.g., intrinsic capacitance of gain cell 211 within amplifier 200) are replaced with parallel resonant circuits (e.g., the parallel resonant circuit formed by discrete inductor 260B and the intrinsic input capacitance of gain cell 261B within amplifier 250); and 2) series inductors (e.g., discrete inductor 210 within amplifier 200) are replaced with series resonant circuits (e.g., the series resonant circuit formed by discrete inductor 260A and discrete capacitor 261A within amplifier 250). Distributed amplifier 250 provides improved bandlimiting and overcomes the problem of gain-dependent bandwidth by: 1) summing the output of multiple low-gain amplifiers to mitigate the Miller effect; and 2) forming the constituent reactive impedance segments (e.g., L-section 270) of a bandpass filter by grouping discrete inductors with discrete capacitors in a series arrangement (e.g., the grouping of inductor 260A with capacitor 261A), and by grouping discrete inductors with the intrinsic capacitances of active devices in a parallel arrangement (e.g., the grouping of inductor 260B with the intrinsic input capacitance of transconductance/gain cell 261B). Therefore, the gain of amplifier 250 is independent of bandwidth, and increases linearly as the number of distributed stages increases, according to $$A_V = \frac{1}{2} \cdot n \cdot g_m \cdot R_{term},$$

where: 1) n is the number of L-sections (i.e., the number of gain cells); 2) $g_m$ is the transconductance associated with each gain cell; and 3) $R_{term}$ is the terminating impedance for the bandpass filter. It should be noted that although the active ladder networks of exemplary amplifier 250 derive from a bandpass filter prototype where the shunt reactances, formed by parallel resonant circuits, are coupled to each other via series resonant circuits (e.g., the parallel resonant circuit comprising inductor 260B and the intrinsic input capacitance of transconductance/gain cell 261B, is coupled by the series resonant circuit comprising inductor 260A and capacitor 261A), other arrangements can be utilized and should be considered within the scope of the invention. For example, suitable bandpass responses can be realized by alternate arrangements where shunt reactances are inductively coupled (e.g., filter 170C of FIG. 8C), or by an arrangement where the shunt reactances are capacitively coupled (e.g., filter 170D of FIG. 8D). These alternate arrangements also should be considered within the scope of the invention. Furthermore, those skilled in the art will readily appreciate that the gain cells associated with any of the reactive impedance segments (i.e., L-sections) can be implemented using various conventional topologies, including any of the conventional topologies illustrated in FIGS. 6A-D. Embodiments employing gain cells of various topologies also should be considered within the scope of the invention.

Figure 10A:
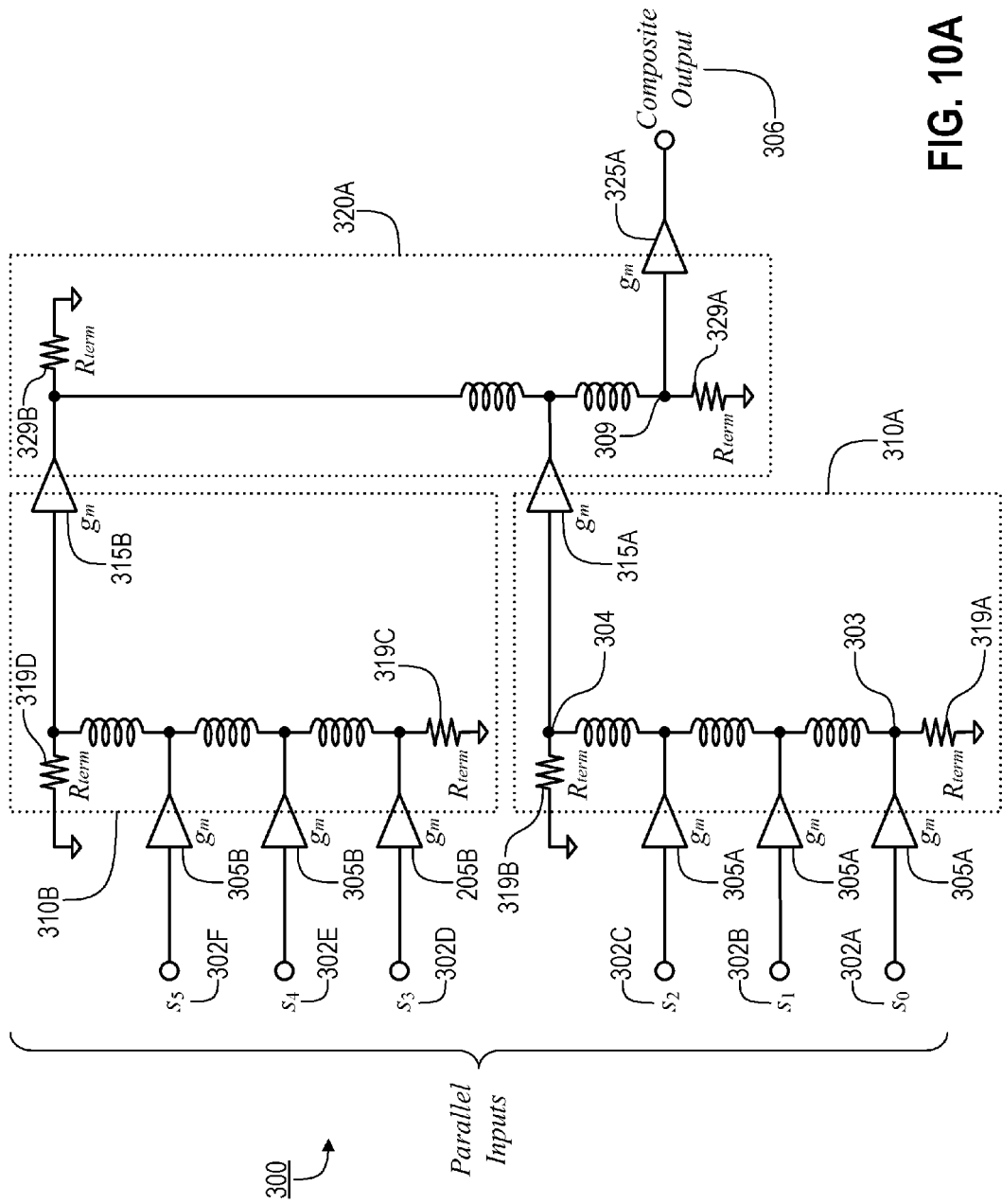
FIG. 10A is a diagram of a distributed combiner according to a representative embodiment of the invention, which subjects input signals to incrementally different time delays, and utilizes an array of reactive impedance segments with active coupling elements, to combine six input signals into a single output signal.
Figure 10B:
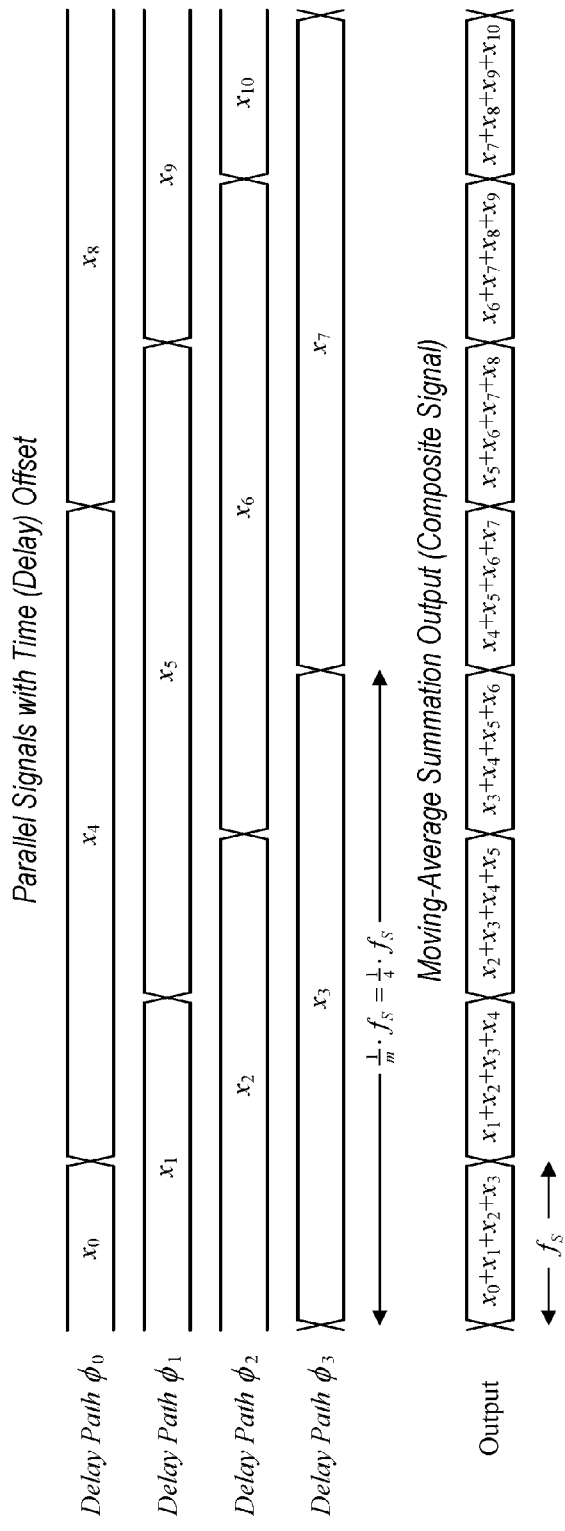
FIG. 10B is a timing diagram which illustrates the principles of moving-average summation, according to a representative embodiment of the invention.

Another alternative exemplary combiner, according to the preferred embodiments of the present invention, is distributed combiner 300 shown in FIG. 10A. The functionality of exemplary combiner 300 is comparable to that of exemplary combiners 100A-C, except that input signals (e.g., signals 302A-F) are incrementally offset (delayed) in time as they propagate through active ladder networks (e.g., networks 310A&B and 320A) and are combined into a single output signal (e.g., composite signal 306). More specifically, as each input signal propagates to the combiner output, it preferably passes through a different number of similar reactive impedance segments, or alternatively passes through dissimilar reactive impedance segments, such that: 1) each of the input signals is delayed in time by a different amount; and 2) the difference in delay between any two input signals is an integer multiple of a common delay increment. The process of combining input signals, which have been incrementally delayed in time according to these preferred embodiments, is sometimes referred to as moving-average summation. The process of moving-average summation is depicted in the timing diagram given in FIG. 10B, which for an exemplary summation of four input signals (i.e., decomposition in time by a factor of m=4), illustrates the manner in which input signals are incrementally delayed in time (e.g., by an amount equal to $\Delta\phi=1/f_S$) and then combined to produce a resultant signal with a higher transition density (e.g., a transition density at a higher rate of $f_S$ as opposed to a lower rate of $$\frac{1}{m} \cdot f_S = \frac{1}{4} \cdot f_S).$$

Figure 10C:
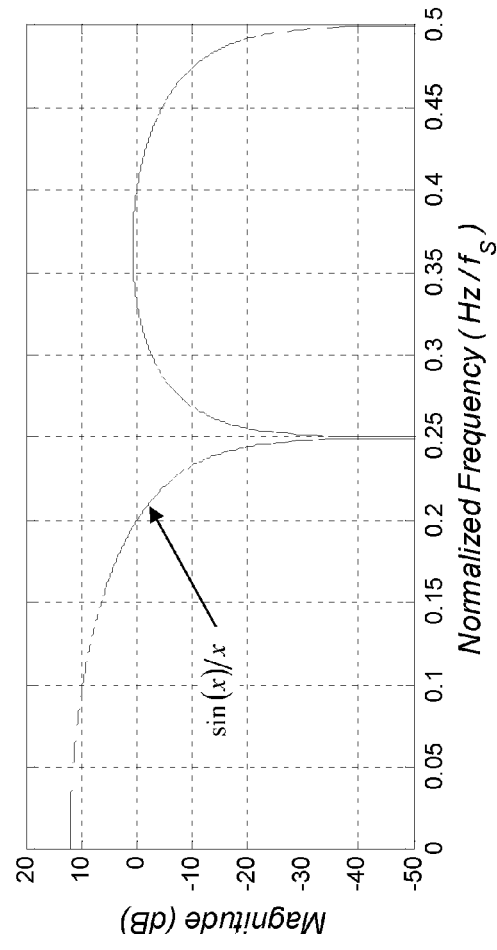
FIG. 10C illustrates the magnitude response versus frequency for moving-average summation, according to a representative embodiment of the invention.

It can be shown that phase-offset resampling and summing (i.e., moving-average summation), according to the preferred embodiments, introduces what is conventionally referred to as a moving-average filter response, which has a continuous-time transfer function given by $$TF(s) = \sum_{k=0}^{m-1} \exp(-s \cdot k \cdot \Delta\phi),$$

where: 1) m is the polyphase (time) decomposition factor equal to the number of input signals; and 2) $\Delta\phi=1/f_S$ is the incremental time offset by which input signals are delayed in various integer multiples. The above transfer function produces a lowpass response with a sin(x)/x or sin c(x) shape, and a 3 dB cutoff frequency of approximately $1/(2 \cdot m \cdot \Delta\phi)$. The magnitude versus frequency response of the moving-average summation operation is given in FIG. 10C for an exemplary decomposition factor of m=4. As a consequence of this moving-average summation, combiner 300 preferably is utilized only in situations where time-interleaved processing is employed (i.e., compared to combiners 100A-C which have utility for both time-interleaved and frequency-interleaved processing). Furthermore, the common delay increment preferably is less than the period of an intended maximum operating frequency for the combiner.

Referring back to FIG. 10A and exemplary combiner 300, three active ladder networks (e.g., ladder networks 310A&B and 320A) are utilized to reconstruct a continuous-time output signal (e.g., composite signal 306) from six continuous-time input signals (e.g., signals 302A-F). In the preferred embodiments of combiner 300, the outermost (terminal) junction points (e.g., junction points 303 and 304) of each active ladder network are terminated in the characteristic impedance of a reactive impedance segment (e.g., terminated by shunt resistors 319A-D and 329A&B), and one outermost (terminal) junction point is coupled to another active ladder network (e.g., at junction point 304), or is coupled to the output of the combiner (e.g., at junction point 309). In alternate embodiments, however, an inner junction point is coupled to another active ladder network, and/or an inner junction point is coupled to the output of the combiner. In exemplary converter 300, each of first ladder networks 310A&B preferably comprises the same number of similar (or identical) reactive impedance segments (e.g., networks 310A&B comprise three identical reactive impedance segments), such that: 1) each reactive impedance segment introduces a time delay of $\Delta\phi=1/f_S$; and 2) the total time delay introduced to any input signal is proportional to the number of reactive impedance segments through which is propagates. In passing through a first set of active ladder networks (e.g., ladder networks 310A&B), therefore, input signals 302C&F are subjected to an initial delay of $\Delta\phi$, inputs signals 302B&E are subjected to an initial delay of $2 \cdot \Delta\phi$, and input signals 302A&D are subjected to an initial delay of $3 \cdot \Delta\phi$. Input signals are subjected to additional delays as they propagate though a second active ladder network (e.g., ladder network 320). In the preferred embodiments, second ladder network 320 preferably comprises identical reactive impedance segments, each of which introduces a delay equal to the total delay of a first active ladder network (e.g., the total delay of first active ladder network 310A is $3 \cdot \Delta\phi$). Consequently, second active ladder network 320A of combiner 300 comprises two reactive impedance segments, each of which introduces a delay of $n \cdot \Delta\phi$, where n is the number of reactive impedance segments in a first active ladder network (e.g., first ladder networks 310A&B) and n also is equal to the number of signals pro vided as inputs to a first ladder network. As a result of passing through a second active ladder network (e.g., ladder networks 320A), therefore, input signals are subjected to time delays as follows:

1) input signal 302C is subjected to a total delay of $\Delta\phi+3 \cdot \Delta\phi=4 \cdot \Delta\phi$;

2) input signal 302B is subjected to a total delay of $2 \cdot \Delta\phi+3 \cdot \Delta\phi=5 \cdot \Delta\phi$;

3) input signal 302A is subjected to a total delay of $3 \cdot \Delta\phi+3 \cdot \Delta\phi=6 \cdot \Delta\phi$;

4) input signal 302F is subjected to a total delay of $\Delta\phi+6 \cdot \Delta\phi=7 \cdot \Delta\phi$;

5) input signal 302E is subjected to a total delay of $2 \cdot \Delta\phi+6 \cdot \Delta\phi=8 \cdot \Delta\phi$; and 6) input signal 302D is subjected to a total delay of $3 \cdot \Delta\phi+6 \cdot \Delta\phi=9 \cdot \Delta\phi$.

According to the exemplary processing of combiner 300, therefore, the combining process is such that each input signal is delayed by a different amount, and the difference in delay between any two input signals is an integer multiple of a common delay increment.

Figure 10D:
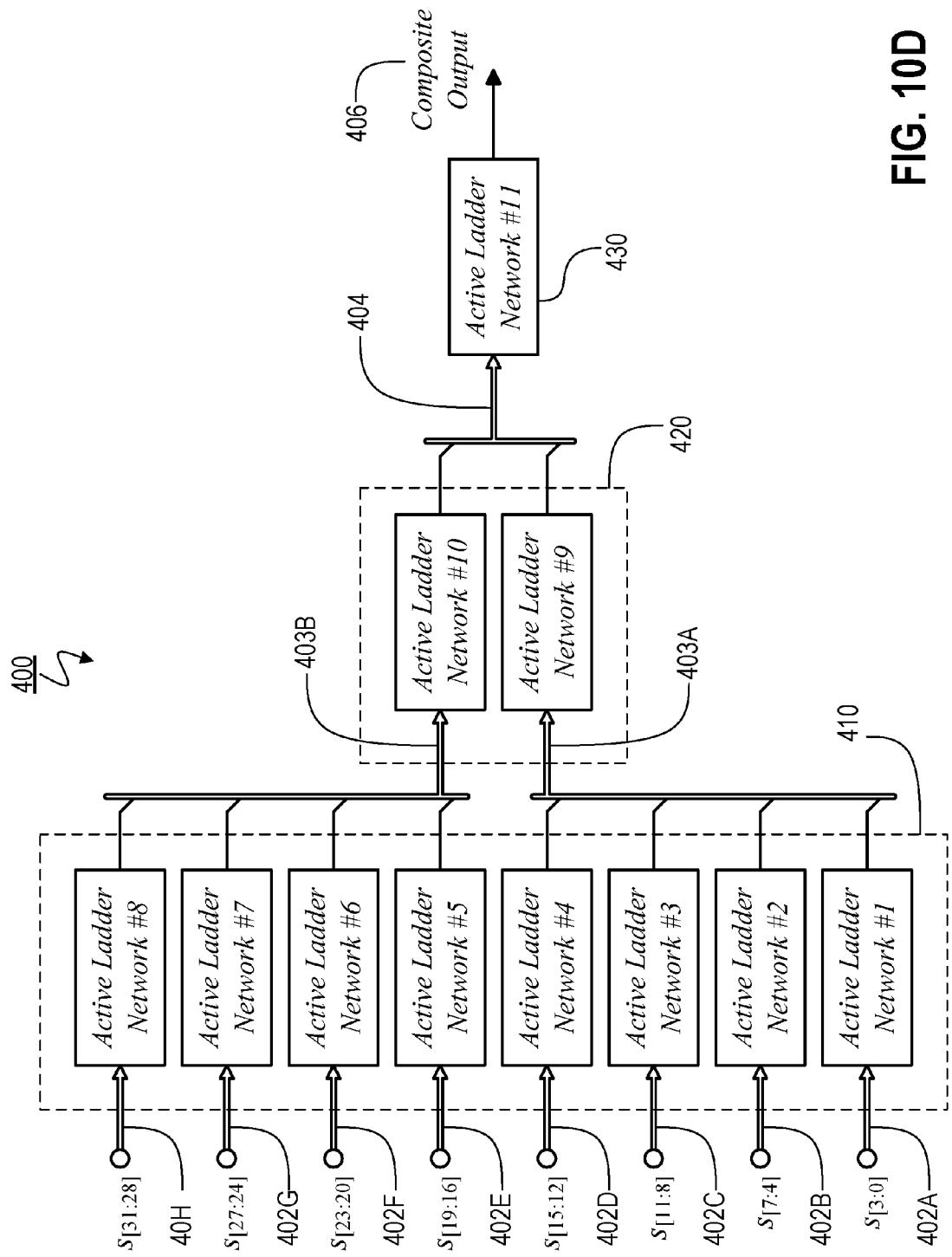
FIG. 10D is a block diagram of a distributed combiner according to a representative embodiment of the invention, in which 32 input signals are combined into a single output signal, using an array of active ladder networks.

In the preferred embodiments of combiner 300, the number of reactive impedance segments included within a particular active ladder network, is equal to the number of signals which are coupled as inputs to that particular ladder network. For example, three signals are coupled as inputs to each of ladder networks 310A&B, and each of ladder networks 310A&B include three reactive impedance segments. Moreover, two signals are coupled as inputs to ladder network 320A, and ladder network 320A includes two reactive impedance segments. More generally, however, an active ladder network can comprise any number of reactive impedance segments and a combiner can utilize any number of active ladder networks, preferably provided that: 1) the total number of reactive impedance segments in the entire combiner network exceeds or equals the number of input signals which are summed to form an output signal; and 2)

as input signals propagate through the combiner they are delayed such that the difference in delay between any two input signals is an integer multiple of a common delay increment. FIG. 10D is a more general block diagram of a combiner (e.g., combiner 400) according to the preferred embodiments of exemplary combiner 300. Combiner 400 reconstructs an output signal (e.g., composite signal 406) via the summation of 32 input signals (e.g., the four separate input signals comprising each of inputs 402A-H). Combiner 400 utilizes a total of eleven active ladder networks in an arrangement consisting of eight first ladder networks 410; two second ladder networks 420; and one third ladder network 430. However, in alternate embodiments other numbers of first ladder networks, second ladder networks and/or third ladder network instead may be used. The structure of an exemplary embodiment of combiner 400 is such that: 1) each of the first ladder networks has a total (maximum) delay of $4 \cdot \Delta\phi$ (i.e., the number of signals, 4, provided as inputs times $\Delta\phi$), with each of its input signals delayed by an integer number 1-4, respectively, times $\Delta\phi$; 2) each of the second ladder networks has a total (maximum) delay of $16 \cdot \Delta\phi$ (i.e., the number of signals, 4, provided as inputs times the delay $4 \cdot \Delta\phi$ of each of the first ladder networks in the previous level), with each of its input signals delayed by an integer number 1-4, respectively, times $4 \cdot \Delta\phi$; and 3) the third ladder network has a total delay of $32 \cdot \Delta\phi$ (i.e., the number of signals provided as inputs, 2, times $16 \cdot \Delta\phi$), with each of its input signals delayed by an integer number 1 or 2, respectively, times $16 \cdot \Delta\phi$.

Additional Considerations

As used herein, the term "coupled", or any other form of the word, is intended to mean either directly connected or connected through one or more other elements, such as reactive impedance segments, passive elements, gain cells, or other processing blocks. The shunt capacitance associated with a reactive impedance segment (i.e., L-section) is intended to mean the capacitance introduced by a passive component (e.g., discrete capacitor), or by the intrinsic (parasitic) capacitance at the input and/or output of an active device.

The embodiments discussed above concern, among other things, nested sets of ladder networks, with each ladder network effecting summation of the signals that are input into it, and with outputs of earlier ladder networks coupled to the inputs of later ladder networks, so that the number of input signals are summed together using a multi-staged summation structure. As used herein, unless explicitly stated otherwise, the terms "summation", "sum" and any other forms of the word are intended to mean added together, whether on a weighted or non-weighted basis, whether the individual signals have been subject to the same or different amounts of delay prior to summation, and/or whether the individual signals are directly summed, subjected to substantially identical processing prior to summation, or are subject to different kinds of processing prior to summation. Different embodiments will employ different options in this regard (e.g., the same or different relative weightings, the same or different relative delays and/or the same or different pre-processing) to achieve different desired results, e.g., as noted above.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for combining a plurality of inputs, said apparatus comprising:
a plurality of input lines that receive a corresponding plurality of input signals that are continuous in time;
a first set of ladder networks, each said ladder network in the first set having: a first terminal junction point, a second terminal junction point, an inner junction point, and first and second input junction points, with each of said first and second input junction points either coupled to a different one of the input lines or provided with a zero input signal;
a second ladder network having a first terminal junction point, a second terminal junction point, an inner junction point, and first and second input junction points, each coupled to the inner junction point of a different one of the ladder networks in said first set; and
an output line coupled to the inner junction point of said second ladder network and providing an output signal that is continuous in time,
wherein each of the ladder networks includes a number of reactive impedance segments, with each said reactive impedance segment including: (a) at least one series reactance, (b) at least one shunt capacitive element which at least one of (i) is implemented as a discrete capacitor or (ii) derives from an active device, and (c) a junction point to which the reactance and capacitive element are coupled,
wherein at least one of the terminal junction points within each of the plurality of said ladder networks is terminated in a characteristic impedance of said ladder network at said at least one terminal junction point,
wherein a signal at the inner junction point of each of said ladder networks comprises a summation of signals provided at the first and second input junction points of said ladder network, so that the signal at the inner junction point of each of the ladder networks in the first set comprises a summation of at least two of the input signals and the signal at the inner junction point of the second ladder network comprises a summation of at least one additional input signal, and wherein said input signals are different continuous-time versions of an underlying discrete-time signal and are combined by said ladder networks according to a weighting that reflects a discrete-time to continuous-time encoding.

2. An apparatus according to claim 1, wherein said series reactance is a discrete inductive element.

3. An apparatus according to claim 1, wherein said series reactance is a series resonant circuit.

4. An apparatus according to claim 1, wherein at least one of said reactive impedance segments additionally includes at least one shunt inductive element, which forms a parallel resonant circuit with a shunt capacitive element.

5. An apparatus according to claim 4, wherein said series reactance is a series resonant circuit, and said reactive impedance segments have a frequency response that is bandpass.

6. An apparatus according to claim 1, wherein at least two of said reactive impedance segments additionally include at least one shunt inductive element, which forms a parallel resonant circuit with a capacitive element, and said reactive impedance segments have a frequency response that is bandpass.

7. An apparatus according to claim 6, wherein the series reactance of said reactive impedance segments is a discrete capacitive element.

8. An apparatus according to claim 1, wherein a signal provided to at least one of the first or second input junction points of at least one of said ladder networks in the first set is equal to zero.

9. An apparatus according to claim 8, wherein said ladder network includes at least one discrete capacitor.

10. An apparatus according to claim 1, wherein the number of reactive impedance segments within any given ladder network is equal to a total number of signals that are provided as inputs to said given ladder network.

11. An apparatus according to claim 1, wherein the number of reactive impedance segments within any given ladder network is different from the total number of signals that are provided as inputs to said given ladder network.

12. An apparatus according to claim 1, wherein said input signals are subjected to approximately equal amounts of delay in time and scaling in magnitude as they propagate through said apparatus and are combined into an output signal.

13. An apparatus according to claim 12, wherein said input signals pass through an equal number of reactive impedance segments as they propagate through said apparatus and are combined into an output signal.

14. An apparatus according to claim 12, wherein said input signals pass through a different number of reactive impedance segments as they propagate through said apparatus to form an output signal.

15. An apparatus according to claim 1, wherein at least two of said input signals are different bits from a multi-bit output of a digital-to-analog converter, wherein said discrete-time to continuous-time encoding is binary, and wherein said at least two of said input signals are combined into said output signal in a proportion which reflects a binary weighting.

16. An apparatus according to claim 1, wherein at least two of said input signals have been produced by different parallel processing paths of a digital-to-analog converter which employs frequency interleaving, and wherein said at least two of said input signals are combined in a proportion which reflects equal weighting.

17. An apparatus according to claim 1, wherein at least two of said input signals are different bits from a multi-bit output of a digital-to-analog converter, wherein said discrete-time to continuous-time encoding is unary, and wherein said at least two of said input signals are combined in a proportion which reflects equal weighting.

18. An apparatus according to claim 1, wherein at least two of said input signals have been generated as the time-delayed outputs of delta-sigma modulation, and said at least two input signals are combined in a proportion which reflects coefficients of a noise cancellation filter applied to an output of said modulation.

19. An apparatus according to claim 18, wherein said input signals are subjected to a bandpass response by said apparatus, and said bandpass response corresponds to a stopband region in a transfer function of said noise cancellation filter.

20. An apparatus according to claim 1, wherein a frequency response of each of the reactive impedance segments has an upper cutoff frequency that equals or exceeds a maximum intended operating frequency for said apparatus.

21. An apparatus according to claim 1, wherein a total number of ladder networks is equal to a total number of said input signals.

22. An apparatus according to claim 1, further comprising a third ladder network having a first terminal junction point, a second terminal junction point, an interior junction point, and first and second input junction points, each coupled to the interior junction point of a different one of the ladder networks in said first set, so that the signal at the interior junction point of the third ladder network comprises a summation of input signals that are different than the input signals summed by the second ladder network.

23. An apparatus according to claim 1, wherein each of the ladder networks also includes a plurality of gain cells.

24. An apparatus according to claim 1, wherein said input signals are subjected to time delays and a difference in delay between any two input signals is an integer multiple of a common delay increment, and wherein said common delay increment is less than or equal to a period of a maximum operating frequency for said apparatus.

25. An apparatus according to claim 24, wherein the summation of signals produces a filter response with a lowpass cutoff frequency that exceeds or equals a maximum operating frequency for said apparatus.

26. An apparatus according to claim 25, wherein said filter response is approximately a sine function.

27. An apparatus according to claim 24, wherein at least one of said ladder networks comprises a total number of reactive impedance segments which is equal to a total number of signals coupled as inputs to said ladder network.

28. An apparatus according to claim 24, wherein at least one of said ladder networks comprises a total number of reactive impedance segments which is greater a total number of signals coupled as inputs to said ladder network.

29. An apparatus according to claim 24, wherein the reactive impedance segments of a given ladder network introduce an approximately equal amount of at least one of a delay in time or a scaling in magnitude.

30. An apparatus according to claim 24, wherein each of the reactive impedance segments of a given ladder network introduces a delay which is equal to a combined delay of all the reactive impedance segments within one of the ladder networks that provides an input to said given ladder network.

31. An apparatus for amplifying a continuous-time input signal, comprising:

an input line for receiving an input signal that is continuous in time;

a first ladder network comprising a plurality of reactive impedance segments and having: a first outer junction point coupled to said input line, a second outer junction point terminated in a characteristic impedance, and an inner junction point;

a second ladder network comprising a plurality of reactive impedance segments and having: a first outer junction point terminated in a characteristic impedance, a second outer junction point, and an inner junction point;

at least one active element which couples the inner junction point of said first ladder network to the inner junction point of said second ladder network; and an output line that is coupled to said second outer junction point of said second ladder network, wherein each of said first and second ladder networks comprises at least two reactive impedance segments, with each of said reactive impedance segments including: (a) at least one series reactance that includes at least one of an inductance or a capacitance, and (b) at least one shunt reactance that includes a parallel resonant circuit with capacitance that derives from at least one of (i) a discrete component, or (ii) the intrinsic properties of an active element, and wherein the apparatus exhibits a bandpass response with a passband that corresponds to an intended frequency range of operation for said apparatus.

32. An apparatus according to claim 31, wherein said series reactance is produced by a series resonant circuit.

33. An apparatus according to claim 31, wherein said series reactance is produced by a series inductor.

34. An apparatus according to claim 31, wherein said series reactance is produced by a series capacitor.

35. An apparatus for providing a continuous-time output signal by summing a plurality of input signals, said apparatus comprising:

a plurality of input lines for receiving a plurality of input signals that are continuous in time;

a first set of ladder networks, each said ladder network in the first set having: a first terminal junction point, a second terminal junction point, an inner junction point, and first and second input junction points, with each of said first and second input junction points either coupled to a different one of the input lines or provided with a zero input signal;

a second ladder network having a first terminal junction point, a second terminal junction point, an inner junction point, and first and second input junction points, each coupled to the inner junction point of a different one of the ladder networks in said first set; and an output line coupled to the inner junction point of said second ladder network and providing an output signal that is continuous in time, wherein each of the ladder networks includes a number of reactive impedance segments, with each said reactive impedance segment including: (a) a series reactance, (b) a shunt reactance which includes at least one of (i) a discrete capacitor or (ii) a capacitance that derives from an active device, and (c) a junction point to which the series reactance and shunt reactance are coupled, wherein at least one of the terminal junction points within each of the plurality of said ladder networks is terminated in a characteristic impedance of said ladder network at said at least one terminal junction point, wherein a signal at the inner junction point of each of said ladder networks comprises a summation of signals provided at the first and second input junction points of said ladder network, so that the signal at the inner junction point of each of the ladder networks in the first set comprises a summation of at least two of the input signals and the signal at the inner junction point of the second ladder network comprises a summation of at least one additional input signal, and wherein for at least one reactive impedance segment: (1) at least one of the series reactance is a series resonant circuit or the shunt reactance is a parallel resonant circuit, and (2) said at least one reactive impedance segment has a frequency response that is bandpass.

36. An apparatus according to claim 35, wherein said input signals are subjected to approximately equal amounts of delay in time and scaling in magnitude as they propagate through said apparatus and are combined into an output signal.

37. An apparatus according to claim 35, wherein said input signals are subjected to time delays, a difference in delay between any two input signals is an integer multiple of a common delay increment, and said common delay increment is less than or equal to a period of a maximum operating frequency for said apparatus.

* * * * *

UNITED STATES PATENT AND TRADEMARK OFFICE
CERTIFICATE OF CORRECTION

PATENT NO. : 9,685,975 B2  
APPLICATION NO. : 14/996497  
DATED : June 20, 2017  
INVENTOR(S) : Christopher Pagnanelli It is certified that error appears in the above-identified patent and that said Letters Patent is hereby corrected as shown below:

In the Specification

Column 1 Line 47, change "band, so on" to --and so on--.

Column 20 Line 30, change "pro vided" to --provided--.

In the Claims

Column 24, Claim 26, Line 46, change "sine function" to --sinc function--.

Signed and Sealed this  
Eighth Day of August, 2017

Joseph Matal  
*Performing the Functions and Duties of the*  
*Under Secretary of Commerce for Intellectual Property and*  
*Director of the United States Patent and Trademark Office*